United States Patent [19]

Yui et al.

[11] Patent Number: 5,708,360
[45] Date of Patent: Jan. 13, 1998

[54] ACTIVE SHIELD GRADIENT COIL FOR NUCLEAR MAGNETIC RESONANCE IMAGING APPARATUS

[75] Inventors: Masao Yui; Masafumi Kondo, both of Kanagawa-ken, Japan

[73] Assignee: Kabushiki Kaisha Toshiba, Kawasaki, Japan

[21] Appl. No.: 528,569

[22] Filed: Sep. 15, 1995

[30] Foreign Application Priority Data

Sep. 16, 1994 [JP] Japan .................................. 6-222270

[51] Int. Cl.$^6$ .................................................. G01V 3/00
[52] U.S. Cl. ................................................ 324/318; 324/322
[58] Field of Search ................................... 324/318, 322, 324/300; 335/299, 216; 128/653.5

[56] References Cited

U.S. PATENT DOCUMENTS

| | | | |
|---|---|---|---|
| 5,177,442 | 1/1993 | Roemer | 324/307 |
| 5,198,769 | 3/1993 | Frese et al. | 324/318 |
| 5,349,318 | 9/1994 | Inoue | 324/318 |
| 5,378,989 | 1/1995 | Barber et al. | 324/318 |
| 5,406,205 | 4/1995 | Muller | 324/318 |
| 5,414,360 | 5/1995 | Westphal | 324/318 |
| 5,497,089 | 3/1996 | Lampman et al. | 324/318 |
| 5,561,371 | 10/1996 | Schenck | 324/318 |
| 5,563,567 | 10/1996 | Westphal | 324/318 |

FOREIGN PATENT DOCUMENTS

| | | |
|---|---|---|
| 4-144543 | 5/1992 | Japan . |
| 5-32883 | 5/1993 | Japan . |
| 5-269099 | 10/1993 | Japan . |

OTHER PUBLICATIONS

Wong et al., Society of Magnetic Resonance in Medicine, Book of Abstracts. vol. 1, "Short Cylindrical Tranverse Gradient Ciols Using Remote Current Return", p. 583, (1992).

Abduljail et al., Proceddings of the Society of Magnetic Resonance in Medicine, vol. 3, "Torque Compensated Asymmetric Gradient Coils for EPI", p. 1306, (1993).

Abduljail et al., Magnetic Resonance in Medicine, vol. 31, "Torque Free Asymmetric Gradient Coils for Echo Planar Imaging", pp. 450–453, (1994).

Carlson et al., "Design and Evaluation of Shielded Gradient Coils", Magnetic Resonance In Medicine No. 26, (1992), pp. 191–206.

Myers et al., Society of Magnetic Resonance in Medicine, Book of Abstracts, vol. 2, "Highly Linear Asymmetric Transverse Gradient Coil Design for Head Imaging", p. 711, (1991).

Primary Examiner—Louis M. Arana
Attorney, Agent, or Firm—Foley & Lardner

[57] ABSTRACT

An active shield gradient coil for a nuclear magnetic resonance imaging, formed by a primary coil having a fingerprint shaped current distribution formed on an inner cylinder in which at least a part of current return lines is cut out, a shield coil having a current distribution formed on an outer cylinder, and a bridging connection member for connecting cut out part of the current return lines of the primary coil with the shield coil, in which the current distribution of the shield coil is a composition of a first shield pattern for cancelling out a magnetic field produced by the primary coil outside the outer cylinder and a second shield pattern for cancelling out a magnetic field produced by the bridging connection member outside the outer cylinder. The current distribution of the primary coil can have turn back current paths for leading the cut out part of the current return lines on one end of the gradient coil to another end of the gradient coil.

54 Claims, 19 Drawing Sheets

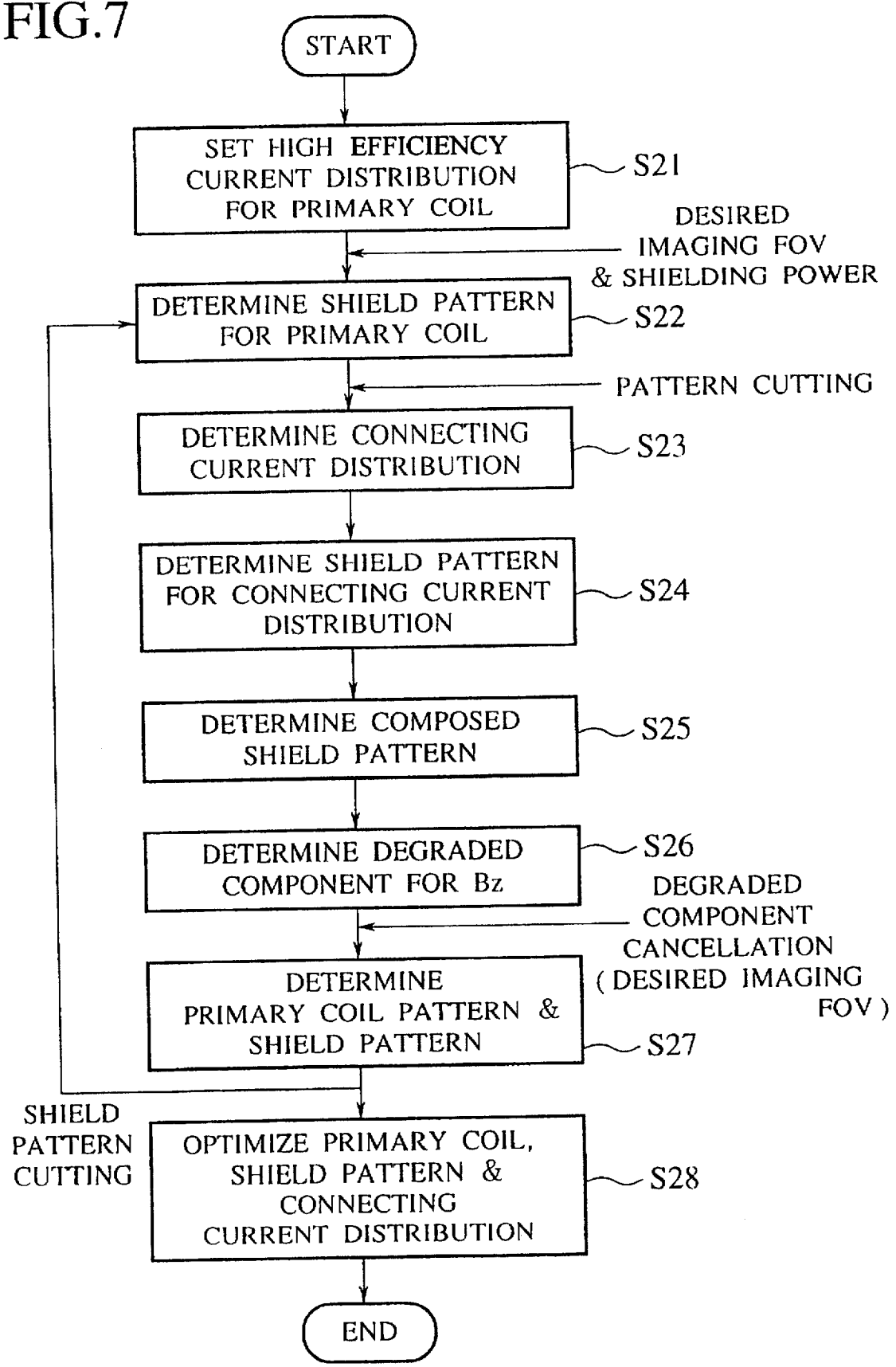

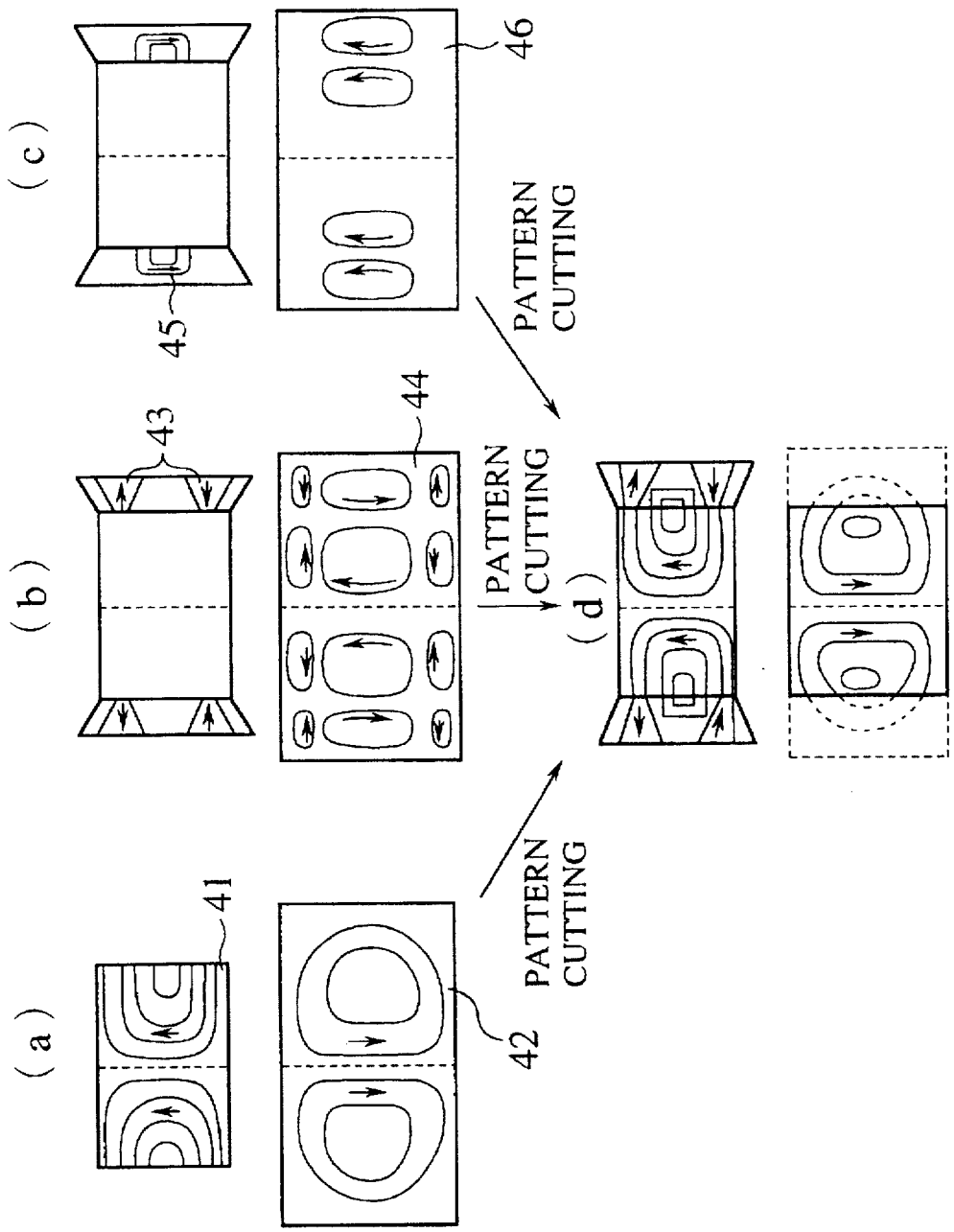

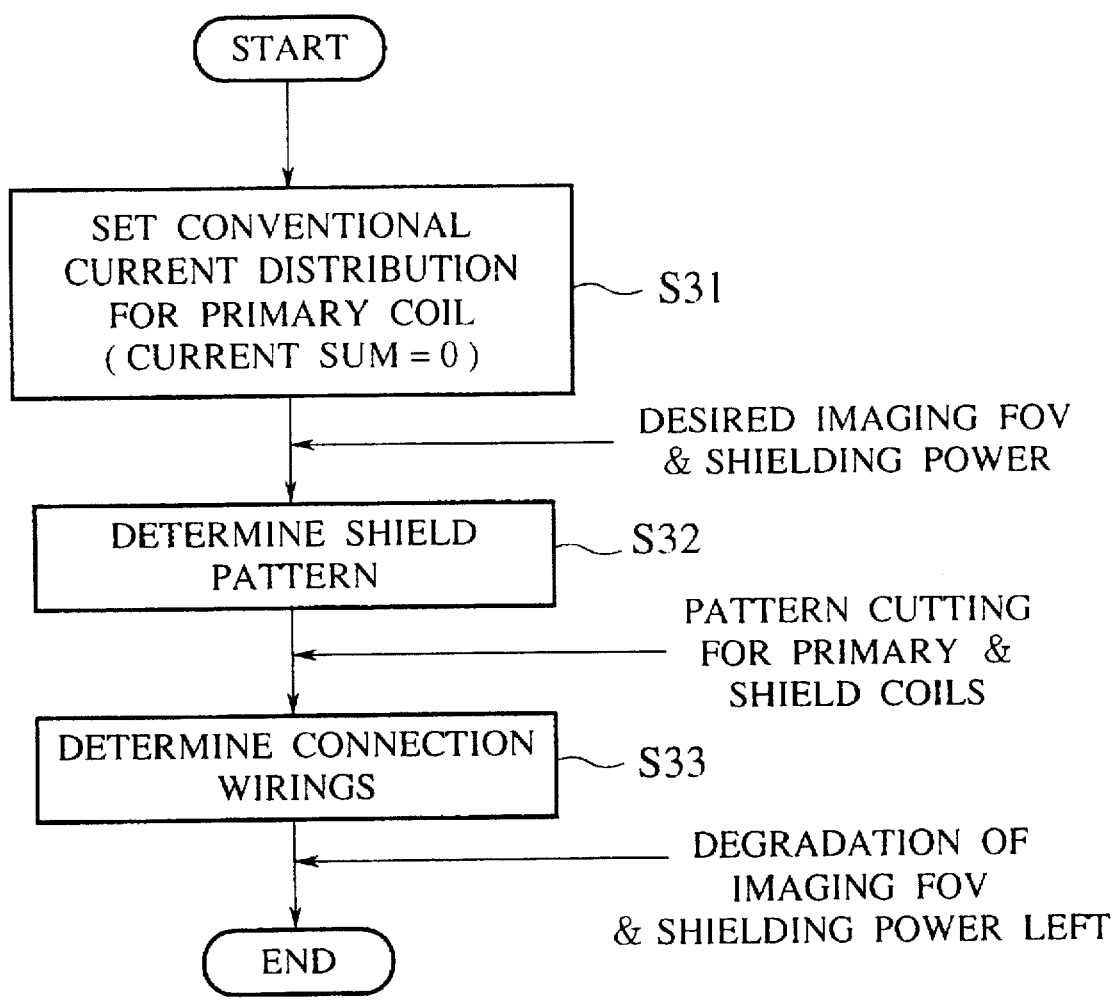

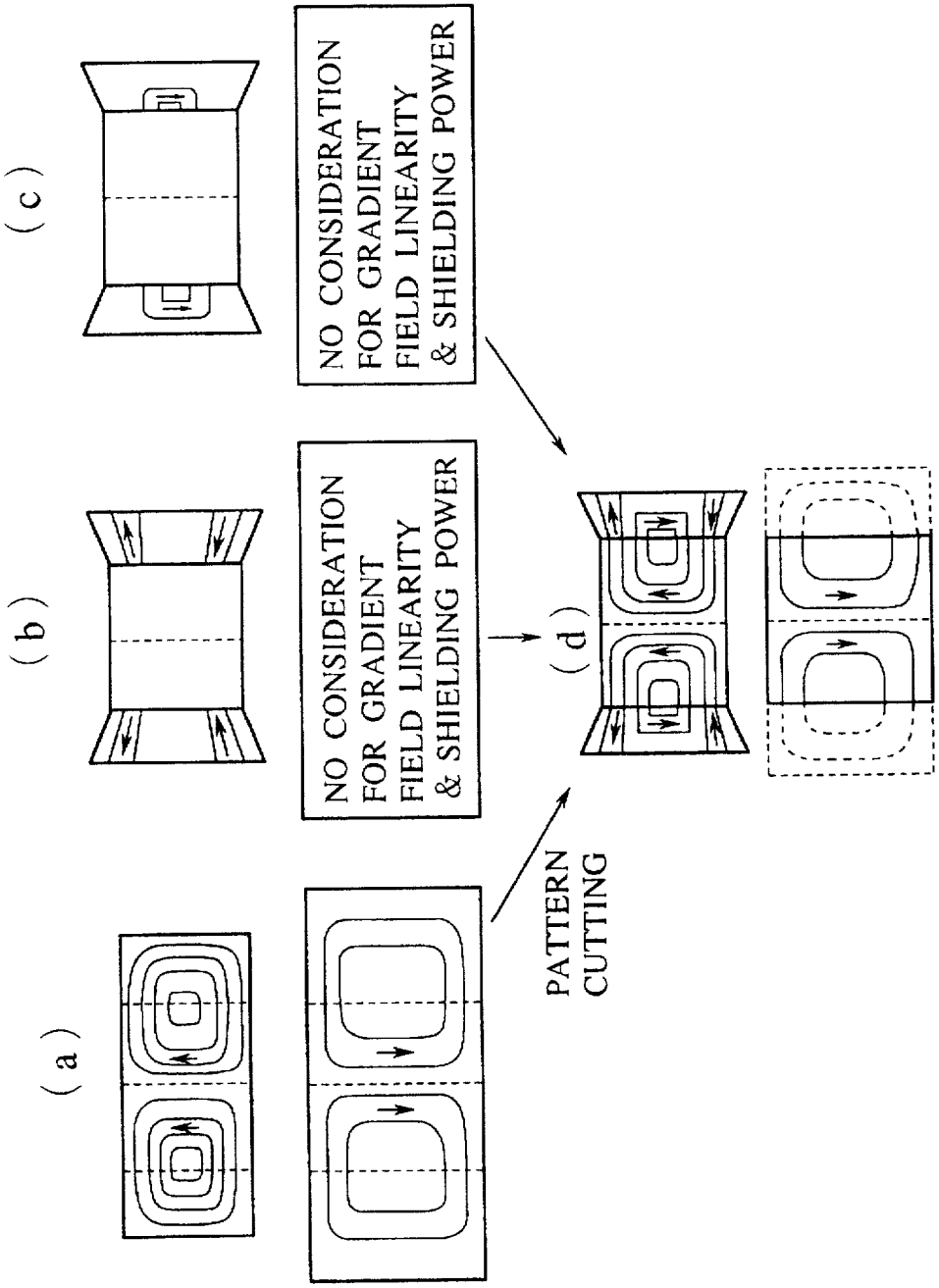

ACTIVE SHIELD GRADIENT COIL FOR NUCLEAR MAGNETIC RESONANCE IMAGING APPARATUS

BACKGROUND OF THE INVENTION

1. Field of the Invention

The present invention relates to a nuclear magnetic resonance imaging apparatus, and more particularly, to a gradient coil for generating a gradient magnetic field in a nuclear magnetic resonance imaging apparatus.

2. Description of the Background Art

In recent years, among various types of medical diagnostic apparatuses developed, the nuclear magnetic resonance imaging (MRI) apparatus has been studied and developed very actively.

As well known, the nuclear magnetic resonance imaging is a method for imaging microscopic chemical and physical information of matters by utilizing the nuclear magnetic resonance phenomenon in which the energy of a radio frequency magnetic field rotating at a specific frequency can be resonantly absorbed by a group of nuclear spins having unique magnetic moments which are placed in a homogeneous static magnetic field.

This nuclear magnetic resonance imaging has attracted much attention because of its capability for imaging not just physical shape information of a living body at high contrast, but also various other types of functional information such as blood flow information, microscopic magnetic field inhomogeneity information, a diffusion information, and chemical shift information.

In an MRI apparatus for carrying out such a nuclear magnetic resonance imaging, depending on a type of an imaging pulse sequence to be used, numerous different manners of switching of the gradient magnetic fields to be superposed onto the static magnetic field will be required.

Examples of the conventionally known imaging pulse sequence to be used in the nuclear magnetic resonance imaging include the usual imaging sequence such as the spin echo sequence and the field echo sequence, the high speed or ultra high speed imaging sequence such as the high speed spin echo sequence, the high speed field echo sequence, and the echo planar sequence, and the nuclear magnetic resonance angiography sequence for obtaining a distribution or a speed of blood flow in blood vessels.

Each of these imaging pulse sequences is associated with a characteristic manner of switching of the gradient magnetic fields, and such a switching of the gradient magnetic fields is known to generate eddy currents on thermal shields and a helium container of the superconducting magnet. These eddy currents can affect temporal and spatial characteristics of the gradient magnetic fields to cause a serious degradation of the image quality in the nuclear magnetic resonance images to be obtained such as blurring.

In order to avoid this problem, there has been a proposition of the so called active shield gradient coil (ASGC). This ASGC is a coil in coaxial double cylinder shape which comprises a primary coil for generating the gradient magnetic field in an interior region by means of current distribution on a cylindrical surface, and a shield coil for effectively cancelling out a leaking magnetic field from the primary coil at an exterior region by means of current distribution of a cylindrical surface enclosing the primary coil.

FIG. 1 shows a typical shield pattern for the ASGC proposed by Roemer et al. The ASGC generates the gradient magnetic field in a direction perpendicular to that of the static magnetic field, so that the primary coil and the shield coil have spiral shaped current distributions, and each of the primary coil and the shield coil has a current portion for currents generating a desired gradient magnetic field (referred hereafter as a gradient field generating current) and a current portion for currents to be simply returned (referred hereafter as a current return).

This ASGC is associated with a program that the entire current path is long due to the presence of the current returns, and this in turn makes the inductance and the resistance large, such that it is impossible to obtain a high speed gradient magnetic field switching characteristic or a large gradient magnetic field strength, while the driving power increases.

As a solution to this problem, there are conventional propositions for the gradient coil (to be referred hereafter as a simple cutting gradient coil) in which a part or a whole of the current returns of the ASGC is simply cut out and then joined, as disclosed in Japanese Patent Application Laid Open No. 4-144543 (1992) and Wong, Hyde: 11th Annual Meetings of Society of Magnetic Resonance in Medicine, 1992, p. 711. These propositions were aiming at a realization of a high speed gradient magnetic field switching characteristic (or large gradient magnetic field strength) by the reduction of the inductance and the resistance due to the cutting of a part of the current returns.

However, this approach has a problem that the gradient magnetic field linearity (or imaging field of view) and the leaking magnetic field shielding power are considerably degraded because of the simple cutting of the primary coil and the shield coil and the presence of connection wirings between the primary coil and the shield coil. For this reason, the tolerable amount of cutting is limited to a very small amount, and consequently the reduction of the inductance and the resistance is also limited to a very small level.

Thus, up to now, there has been no proposition for a gradient coil with a high field generation efficiency, capable of realizing a high speed gradient magnetic field switching characteristic (or large gradient magnetic field strength) while maintaining the eddy current magnetic field suppression effect and the gradient magnetic field linearity (or imaging field of view) of the ASGC.

On the other hand, in the ASGC, a rate of a region in which the gradient magnetic field linearity is good, i.e., the imaging field of view, with respect to its axial length is small because of the presence of the current returns, and therefore there is a problem that it is impossible to obtain a sufficient imaging field of view in case an axial length of a coil is limited as in a case of a coil for the head portion.

As a solution to these problems, there is a conventional proposition for an asymmetric gradient coil in which the current turns on one side in an axial direction of one coil are turned back to the current turns on another side. FIG. 2 shows a configuration of the gradient coil for a transverse direction proposed by Roemer, as disclosed in Japanese Patent Application Laid Open No. 5-269099 (1993). In this asymmetric gradient coil, a rate of the imaging field of view with respect to an axial length becomes large, and it becomes possible to obtain a sufficient imaging field of view even in a case in which an axial length of a coil is limited.

However, in this asymmetric gradient coil, the inductance is twice as large as that in the usual ASGC for the same gradient magnetic field strength, so that there are problems that it is impossible to obtain a high speed gradient magnetic field switching characteristic or a large gradient magnetic field strength, while the driving power increases, and that torque will be generated due to the Lorentz force exerted on an asymmetric current path.

As a method for cancelling this torque, there are propositions for the asymmetric gradient coil in which additional current returns for cancellation purpose are incorporated, by AbdulJalil et al. and also by Petrapoulas et al., both in 12th Annual Meetings of Society of Magnetic Resonance in Medicine, 1993. In FIG. 3, this type of the asymmetric gradient coil as proposed by Abduljalil et al. is shown. However, this approach has a problem in that the inductance is even more increased due to the additional current returns.

Moreover, these propositions for the asymmetric gradient coil have further problems in that the eddy current magnetic field is not at all suppressed, and that the local heat generation becomes unignorable when a powerful gradient magnetic field is to be generated. In particular, when an outer diameter of the coil is limited, it is impossible to enlarge the cross sectional area of the conductor, so that the local heat generation increases considerably.

Thus, up to now, there has been no proposition for a gradient coil for which the imaging field of view is large, and the inductance increase and the torque generation can be suppressed, while the eddy current magnetic field suppression effect is realized.

SUMMARY OF THE INVENTION

It is therefore an object of the present invention to provide a gradient coil with a high field generation efficiency, capable of realizing a high speed gradient magnetic field switching characteristic (or large gradient magnetic field strength) while maintaining the eddy current magnetic field suppression effect and the gradient magnetic field linearity (or imaging field of view) of a conventional ASGC.

It is another object of the present invention to provide a gradient coil capable of realizing the imaging field of view as large as a conventional asymmetric gradient coil, and the eddy current magnetic field suppression effect as high as a conventional ASGC, while suppressing the inductance increase, the torque generation, and the local heat generation.

It is another object of the present invention to provide a nuclear magnetic resonance imaging apparatus incorporating the above noted gradient coil.

According to one aspect of the present invention there is provided a gradient coil for a nuclear magnetic resonance imaging, comprising: a primary coil having a fingerprint shaped current distribution formed on an inner cylinder in which at least a part of current return lines is cut out; a shield coil having a current distribution formed on an outer cylinder; and a bridging connection member for connecting cut out part of the current return lines of the primary coil with the shield coil; wherein the current distribution of the shield coil is a composition of a first shield pattern for cancelling out a magnetic field produced by the primary coil outside the outer cylinder and a second shield pattern for cancelling out a magnetic field produced by the bridging connection member outside the outer cylinder.

According to another aspect of the present invention there is provided a gradient coil for a nuclear magnetic resonance imaging, comprising: a primary coil having a fingerprint shaped current distribution formed on an inner cylinder in which at least a part of current return lines is cut out, and turn back current paths for leading the cut out part of the current return lines on one end of the gradient coil to another end of the gradient coil; and a shield coil having a current distribution formed on an outer cylinder for cancelling out a magnetic field produced by the primary coil outside the outer cylinder.

According to another aspect of the present invention there is provided a nuclear magnetic resonance imaging apparatus, comprising: a gradient coil including: a primary coil having a fingerprint shaped current distribution formed on an inner cylinder in which at least a part of current return lines is cut out; a shield coil having a current distribution formed on an outer cylinder; and a bridging connection member for connecting cut out part of the current return lines of the primary coil with the shield coil; wherein the current distribution of the shield coil is a composition of a first shield pattern for cancelling out a magnetic field produced by the primary coil outside the outer cylinder and a second shield pattern for cancelling out a magnetic field produced by the bridging connection member outside the outer cylinder; and imaging means for imaging a body to be examined placed in a homogeneous static magnetic field by applying radio frequency magnetic field onto the body to be examined and operating the gradient coil to apply gradient magnetic fields onto the body to be examined according to a pulse sequence, detecting nuclear magnetic resonance signals emitted from the body to be examined in response to the radio frequency magnetic field and the gradient magnetic fields, and processing the nuclear magnetic resonance signals to construct nuclear magnetic resonance images.

According to another aspect of the present invention there is provided a nuclear magnetic resonance imaging apparatus, comprising: a gradient coil including: a primary coil having a fingerprint shaped current distribution formed on an inner cylinder in which at least a part of current return lines is cut out and turn back current paths for leading the cut out part of the current return lines on one end of the gradient coil to another end of the gradient coil; and; a shield coil having a current distribution formed on an outer cylinder for cancelling out a magnetic field produced by the primary coil outside the outer cylinder; and imaging means for imaging a body to be examined placed in a homogeneous static magnetic field by applying radio frequency magnetic field onto the body to be examined and operating the gradient coil to apply gradient magnetic fields onto the body to be examined according to a pulse sequence, detecting nuclear magnetic resonance signals emitted from the body to be examined in response to the radio frequency magnetic field and the gradient magnetic fields, and processing the nuclear magnetic resonance signals to construct nuclear magnetic resonance images.

Other features and advantages of the present invention will become apparent from the following description taken in conjunction with the accompanying drawings.

BRIEF DESCRIPTION OF THE DRAWINGS

FIG. 7 is a flow chart of a procedure for designing the coil pattern of FIG. 5A in the present invention.

FIG. 9 is a diagram illustrating an outline of the procedure shown in FIG. 7 in the present invention.

FIG. 10 is a flow chart of a procedure for designing the coil pattern of FIG. 5B in a conventional case.

FIG. 11 is a diagram illustrating an outline of the procedure shown in FIG. 10 in a conventional case.

DETAILED DESCRIPTION OF THE PREFERRED EMBODIMENTS

Now, with references to the drawings, various embodiment of a gradient coil for a nuclear magnetic resonance imaging apparatus according to the present invention will be described in detail.

Figure 1:
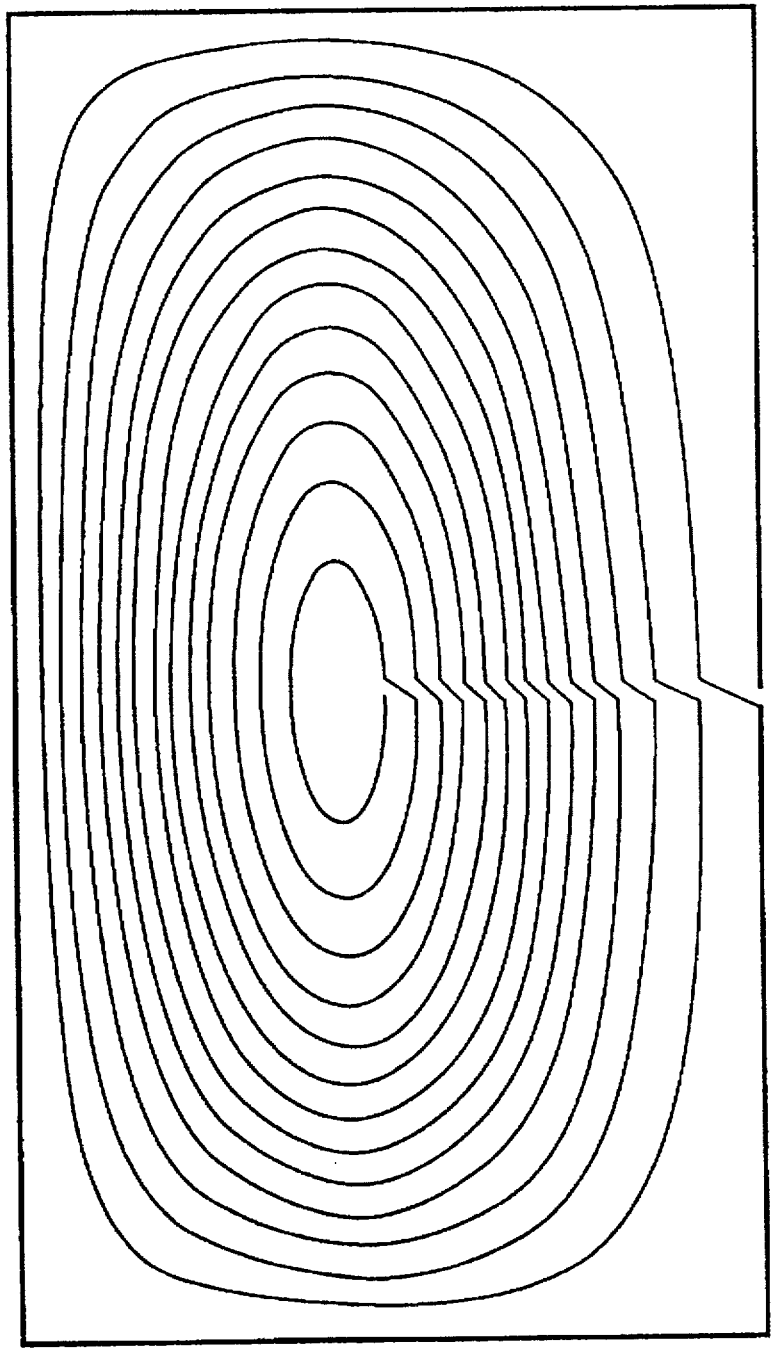
FIG. 1 is an illustration of a typical shield pattern for a conventional ASGC.
Figure 2:
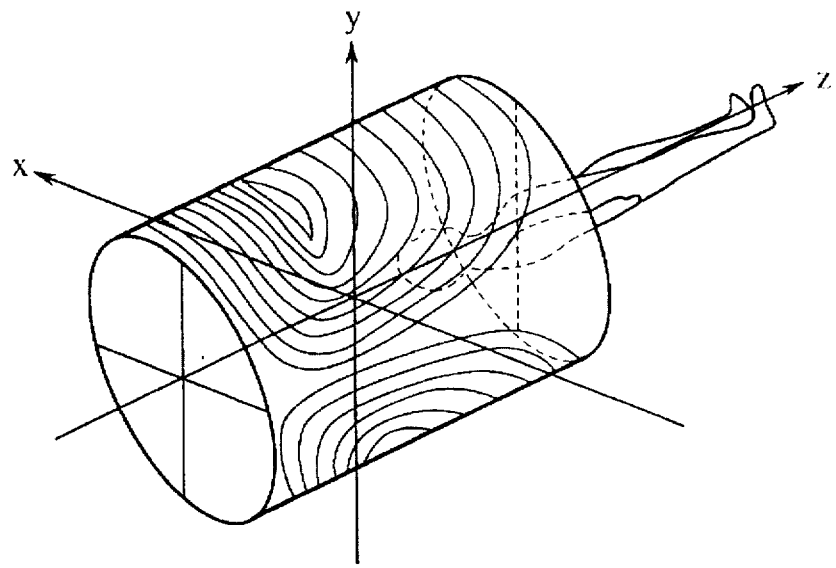
FIG. 2 is a perspective view of a conventional asymmetric gradient coil.
Figure 3:
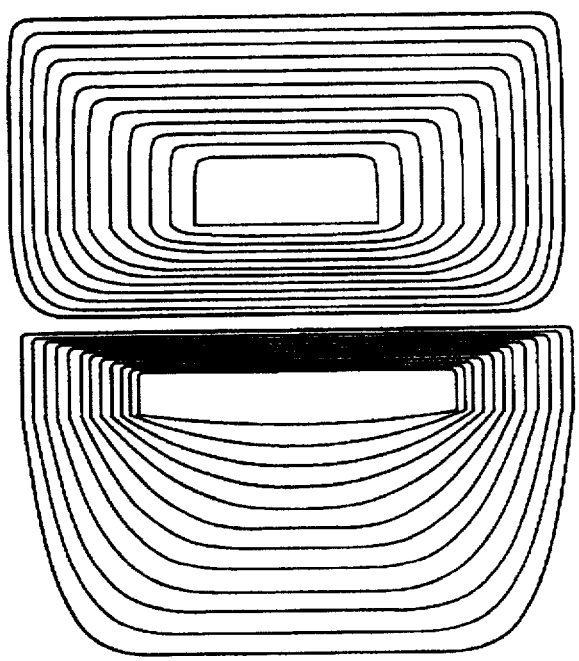
FIG. 3 is an illustration of a coil pattern for another conventional asymmetric gradient coil.
Figure 4:
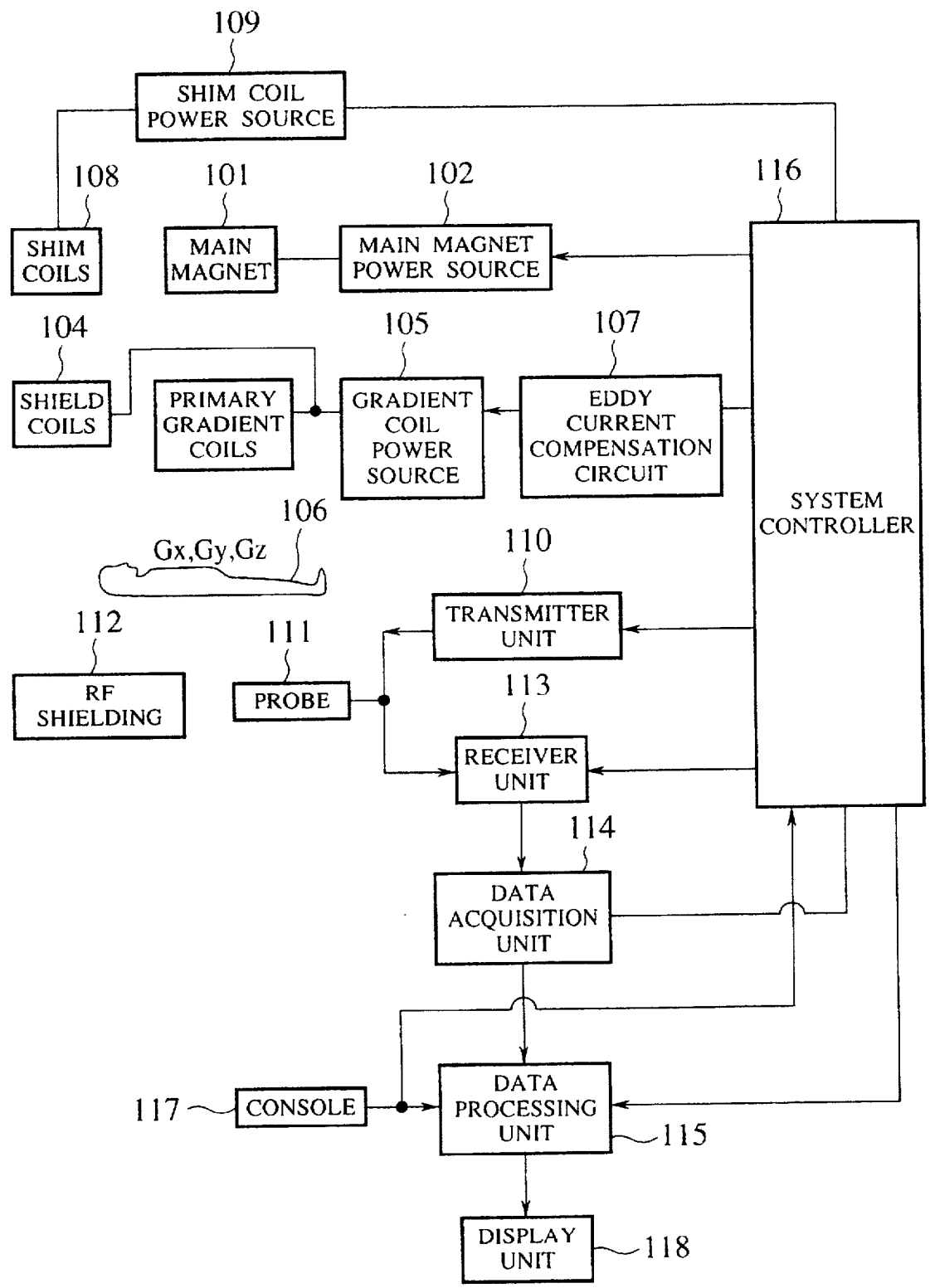
FIG. 4 is a block diagram of a nuclear magnetic resonance imaging apparatus suitable for using a gradient coil according to the present invention.

First, for all the embodiments of the gradient coil to be described in detail below, a suitable nuclear magnetic resonance imaging apparatus has a configuration as shown in FIG. 4.

This nuclear magnetic resonance imaging apparatus of FIG. 4 comprises: a main magnet 101 for generating a static magnetic field; a main magnet power source 102 for driving the main magnet 101; primary gradient coils 103 for generating gradient magnetic fields; shield coils 104 provided around the primary gradient coils 103; a gradient coil power source 105 for driving the primary gradient coils 103 and the shield coils 104; an eddy current compensation circuit 107 for adjusting inputs to the gradient coil power source 105 so as to compensate the effect due to the eddy currents; shim coils 108 for adjusting the homogeneity of the static magnetic field; shim coil power source 109 for driving the shim coils 108; a probe 111 for applying radio frequency (RF) pulses to a body to be examined 106 and receiving nuclear magnetic resonance (NMR) signals from the body to be examined 106; an RF shielding 112 provided between the primary gradient coils 103 and the probe 111; a transmitter unit 110 for driving the probe 111 to transmit the desired RF pulses; and a receiver unit 113 for detecting the NMR signals received by the probe 111.

In addition, this apparatus of FIG. 4 further comprises: a data acquisition unit 114 for acquiring and A/D converting the NMR signals detected by the receiver unit 113; a data processing unit 115 for data processing the A/D converted NMR signals to reconstruct the desired NMR image; a display unit 118 for displaying the NMR image reconstructed by the data processing unit 115; a system controller 116 for controlling the operations of the main magnet power source 102, the gradient coil power source 105, the eddy current compensation circuit 107, the transmitter unit 110, the receiver unit 113, the data acquisition unit 114, and the data processing unit 115, so as to realize the desired imaging pulse sequence; and a console 117 from which an operator enters various control commands to the system controller 116 and the data processing unit 115.

Here, the main magnet 101 is driven by the main magnet power source 102 while the primary gradient coils 103 and the shield coils 104 are driven by the gradient coil power source 105 such that a uniform static magnetic field and the gradient magnetic fields having linear gradients in three mutually orthogonal directions are applied onto the body to be examined 106. The primary gradient coils 103 and the shield coils 104 may be connected in series and driven by the common gradient coil power source 105, or upper, lower, right, and left coil elements may be separately connected with a plurality of gradient coil power sources 105 and separately driven by the respective gradient coil power sources 105. The input signals to be given to the gradient coil power source 105 for compensating eddy current magnetic field time response are generated at the eddy current compensation circuit 107.

In this apparatus of FIG. 4, the body to be examined 106 is placed inside the static magnetic field generated by the main magnet 101, and three orthogonal gradient magnetic fields generated by the primary gradient coils 103 are superposed onto the static magnetic field while the RF pulses are applied by the probe 111, according to the desired imaging pulse sequence. Then, the NMR signals emitted from the patient 106 in response to the application of the RF pulses are received by the probe 111. Here, the common probe 111 may be used for the transmission of the RF pulses and the reception of the NMR signals, or separate probes 111 may be provided for the transmission of the RF pulses and the reception of the NMR signals.

The NMR signals received by the probe 111 is detected at the receiver unit 113, A/D converted at the data acquisition unit 114, and sent to the data processing unit 115 which reconstructs the desired NMR images by using appropriate data processing operations such as the Fourier transformation. The reconstructed NMR images are then displayed at the display unit 118.

Now, the first embodiment of the gradient coil according to the present invention will be described in detail.

Figure 5A:
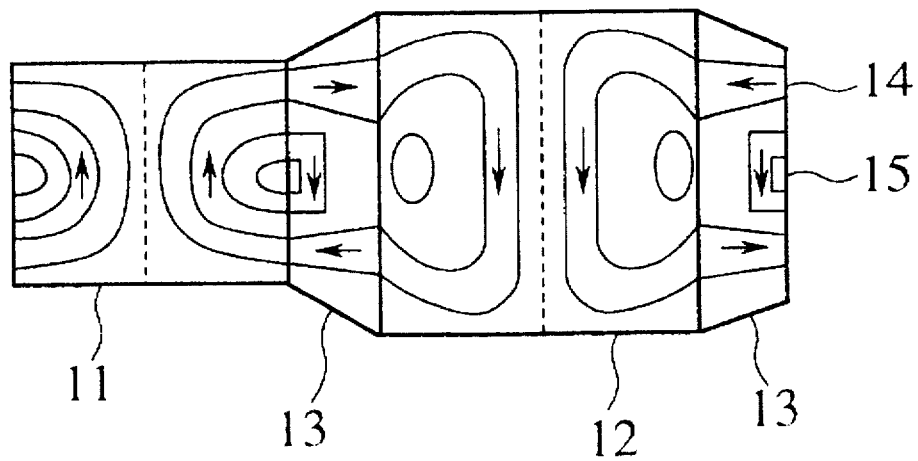
FIG. 5A is a development of a coil pattern for the first embodiment of the gradient coil according to the present invention.
Figure 5B:
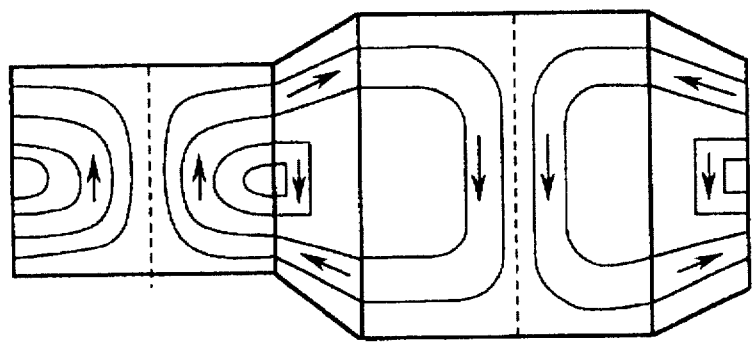
FIG. 5B is a development of a coil pattern for a conventional simple cutting gradient coil.

FIG. 5A shows a configuration of the gradient coil in this first embodiment, while FIG. 5B shows a configuration of a conventional simple cutting gradient coil, where a ½ region of a coil pattern for generating the gradient magnetic field in a direction perpendicular to that of the static magnetic field is developed into a plane.

The gradient coil of FIG. 5A comprises a primary coil 11, a shield coil 12, and a plurality of connecting faces 13 for connecting the primary coil 11 and the shield coil 12, where the primary coil 11 has a current distribution mainly composed of the gradient field generating currents (i.e., current portions for currents generating a desired gradient magnetic field) and the shield coil 12 has a current distribution for effectively cancelling out a magnetic field produced by the primary coil 11 and the connecting faces 13 at an exterior region. Each connecting face 13 includes current components 14 (to be referred hereafter as bridging lines) for connecting the primary coil 11 and the shield coil 12 and current components 15 (to be referred hereafter as remaining current returns) for connecting ends of the horseshoe shaped current patterns on the primary coil 11.

The current distributions of these primary coil 11, shield coil 12, and connecting faces 13 are actually realized by conductors or copper wires in rectangular cross sections which are manufactured into the current distribution patterns by etching, etc.

Here, the shield coil 12 in the gradient coil of FIG. 5A is shaped in a pattern for shielding the magnetic field produced by the current distributions of the primary coil 11 and the connecting faces 13 by means of the designing algorithm to be described in detail below, in contrast to the conventional simple cutting gradient coil of FIG. 5B which is not shaped in a pattern for shielding the leaking magnetic field from the primary coil and the connection wirings.

In addition, the gradient coil of FIG. 5A is shaped in a pattern for securing the gradient magnetic field linearity when all the current distributions are present on the primary coil 11, the shield coil 12, and the connecting faces 13 by means of the designing algorithm to be described in detail below, in contrast to the conventional simple cutting gradient coil of FIG. 5B in which the gradient magnetic field linearity is degraded due to the simple cutting.

Figure 6:
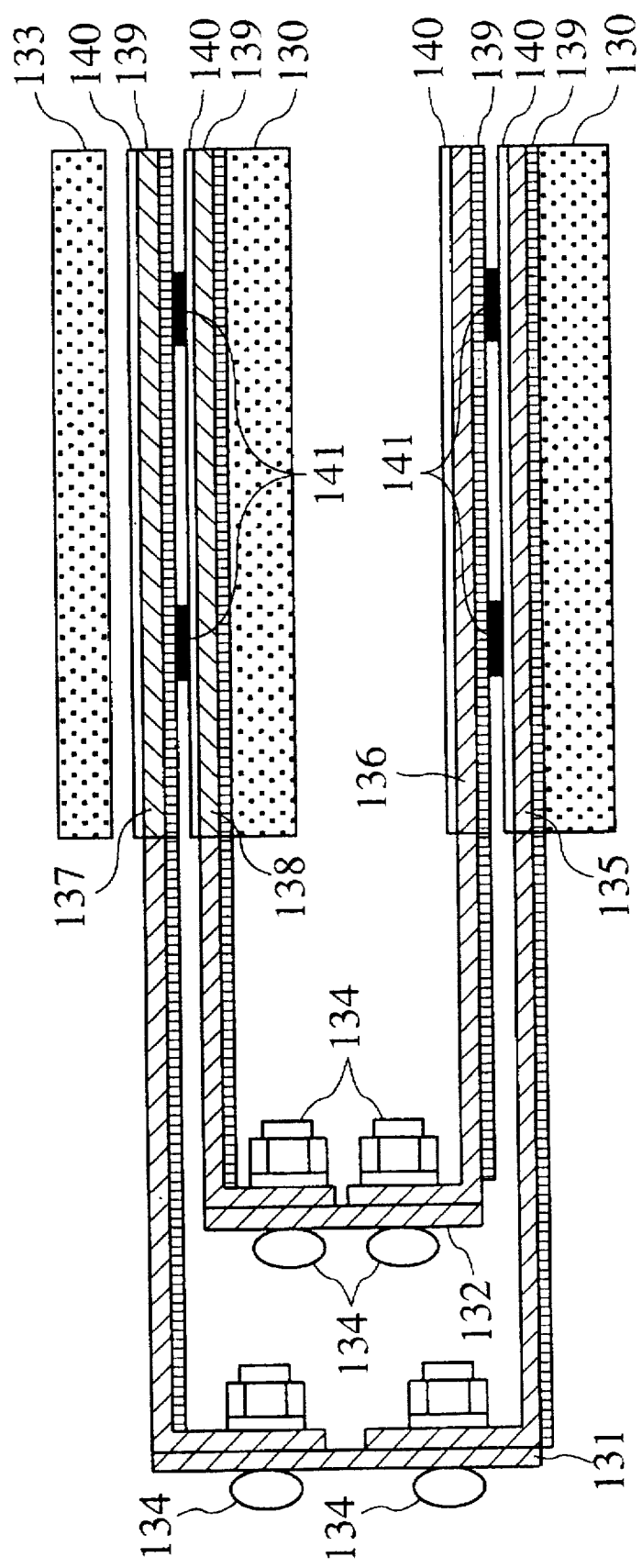
FIG. 6 is a cross sectional view of a gradient coil structure suitable for the first embodiment of the gradient coil according to the present invention.

Now, the gradient coil of this first embodiment can be formed in a structure shown in FIG. 6, which shows a cross sectional view in an axial direction of a layer structure for both X and Y gradient coils in which the current distributions of the connecting faces 13 are formed by connecting the conductors manufactured into the current distribution patterns by etching, etc. to the primary coil conductor and the shield coil conductor by means of screws 134.

More specifically, in FIG. 6, a primary coil conductor layer 135 and a shield coil conductor layer 137 for the X coil are connected by a bridging line 131, a primary coil conductor layer 136 and a shield coil conductor layer 138 for the Y coil are connected by a bridging line 132. Here, a coil pair of the primary coil and the shield coil for the X coil and a coil pair of the primary coil and the shield coil for the Y coil are formed as nested coil pairs. That is, the primary coil 135 for the X coil is located at a position inside the primary coil 136 for the Y coil in a radial direction, and the shield coil 137 for the X coil is located at a position outside the shield coil 138 for the Y coil in a radial direction. It is to be noted that the layer order for the X coil and the Y coil shown in FIG. 6 may be reversed if desired.

Also, as shown in FIG. 6, each conductor layer is fixed to a cylindrical bobbin 130 through an insulative layer 139 made of FRP for example, by means of a fixing tape 140. In addition, spacers 141 are provided between the coil pair for the X coil and the coil pair for the Y coil in order to make it easier to pour the resin for integrating the entire gradient coil. In addition, screw holes for the connection using screws 134 can also be formed by the etching, so that there is no need to make holes at every occasion of connecting.

By realizing the current distributions of the connecting faces 13 in this manner of FIG. 6, it becomes easier to make numerous connections compared with a case of using connections by the copper wires in rectangular cross sections, covered copper wires, etc., and therefore it becomes possible to prevent a manufacturing error such as an erroneous connection of wrong turns.

Next, the designing algorithm to be used in shaping the gradient coil of this first embodiment appropriately as described above will be explained according to the flow chart of FIG. 7.

First, at the step S21, the structures of the primary coil and the shield coil such as their radii are determined, and the high efficiency current distribution for the primary coil which is mainly composed of the gradient field generating currents is set up.

Here, the magnetic field B produced by the current distribution j can be expressed in general by the following equation (1), according to Carlson, et al.: Magnetic Resonance in Medicine, 26, p. 191, 1992, for example.

$$B(\rho,\phi,z) = \frac{\mu_0}{4\pi^2} \sum_{n=-\infty}^{\infty} \int_{-\infty}^{\infty} dk e^{ik(z-z')}e^{im(\phi-\phi')} I_m(\kappa\rho_<)K_m(\kappa\rho_>) \times \quad (1)$$

$$(\nabla \times j)\rho' d\rho' d\phi' dz'$$

where:

$\mu_0$: a magnetic susceptibility of vacuum, $\rho_<$: a smaller one of $\rho$ and $\rho'$ $\rho_>$: a larger one of $\rho$ and $\rho'$, $I_m$: a modified Bessel function of the first kind $K_m$: a modified Bessel function of the second kind The primary coil current distribution $j^p$ and the shield coil current distribution $j^s$ can be expressed in general by the following equations (2) and (3).

$$j^p(\rho', \phi', z') = (0, \sigma_\phi^p(\phi', z')\delta(\rho'-R), \sigma_z^p(\phi', z')\delta(\rho'-R)) \quad (2)$$

$$j^s(\sigma', \phi', z') = (0, \sigma_\phi^s(\phi', z')\delta(\rho'-R'), \sigma_z^s(\phi', z')\delta(\rho'-R')) \quad (3)$$

where:

R: a radius of the primary coil

R': a radius of the shield coil $\sigma_\phi$: a $\phi$-component of the surface current density $\sigma_z$: a z-component of the surface current density The current distribution of the primary coil which is mainly composed of the gradient field generating currents satisfies the following relation (4).

$$\int_{-l/2}^{l/2} \sigma_+^P(\phi',z')dz' \neq 0 \tag{4}$$

where:

l: an axial length of the primary coil

Figure 8A:
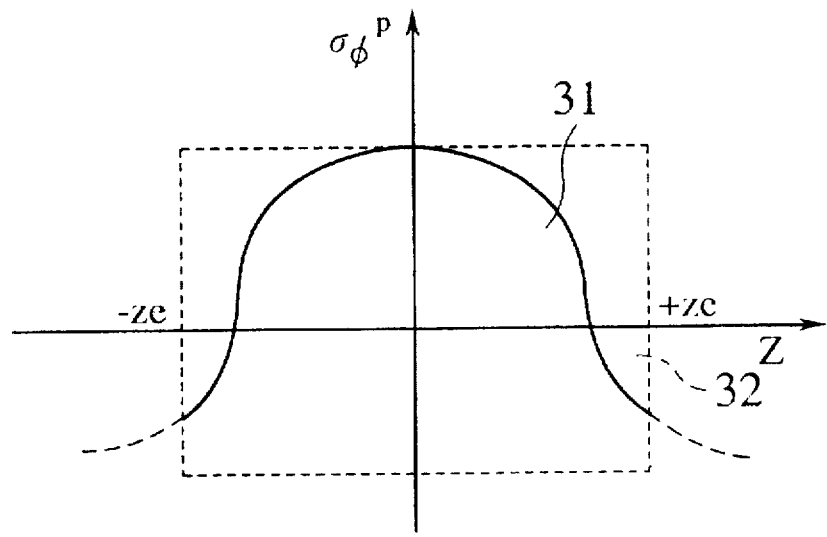
FIG. 8A is a graph showing a z-direction distribution of a typical base function for a $\phi$-direction current component in a primary coil for the gradient coil of FIG. 5A in the present invention.
Figure 8B:
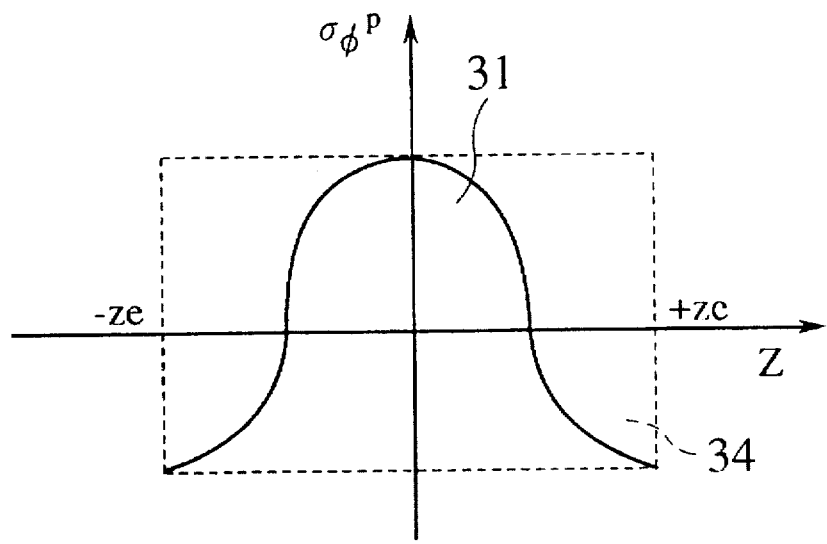
FIG. 8B is a graph showing a z-direction distribution of a typical base function for a $\phi$-direction current component in a primary coil for the gradient coil of FIG. 5B in a conventional case.

FIG. 8A shows a z-direction distribution of a typical base function for the $\phi$-direction current component. Here, an area of a positive portion 31 is larger than an area of a negative portion 32, and a difference between them corresponds to the connecting current component. In contrast, the conventional ASGC has a z-direction distribution as shown in FIG. 8B in which an area of a positive portion 33 and an area of a negative portion 34 are equal.

The above relation (4) can be satisfied by setting the current density $\sigma_\phi$ as in the following equation (5) for example.

$$\sigma_+^P(\phi',z') = \sum_{n,m} a_{nm}\cos\left(\frac{2\pi n z'}{l}\beta\right)e^{jm\phi'}, 0 < \beta < 1 \tag{5}$$

Here, a factor $\beta$ is introduced for the first time by the present invention in order to make it possible to deal with the gradient field generating currents.

Next, at the step S22, the current distribution for the shield coil is determined to obtain a shield pattern corresponding to the primary coil, for desired imaging field of view and shielding power. Here, the current distribution can be determined from the condition that the magnetic field becomes zero outside the shield coil. Here, the procedure for determining the current distribution for the shield coil will be briefly outlined without going into too much details that can be found elsewhere.

From the condition that the z-component of the magnetic field=0, for example, the following equation (6) can be obtained.

$$\hat{\sigma}_{\phi,m}^S(\kappa) = -\frac{R I'_m(\kappa R)}{R I'_m(\kappa R')}\hat{\sigma}_{P,\phi,m}^P \tag{6}$$

where:

$$\hat{\sigma}_{\phi,m}(\kappa) = \frac{1}{2\pi}\int dz' d\phi' e^{-j\kappa z'}e^{-jm\phi'}\sigma_\phi(\phi',z') \tag{7}$$

The coefficient $a_{n,m}$ appearing in the above equation (5) can be determined from the following three conditions: [1] a condition that the gradient magnetic field strength $G_x$ is to be set to a prescribed value $G$, that is $$G_x = \frac{\partial B_z}{\partial x}\bigg|_{\substack{\rho=0\\\phi=0\\z=0}} = G \tag{8}$$

[2] a condition that higher terms of the gradient magnetic field are to be set to 0, that is $$\frac{\partial^{2n}}{\partial x^{2n}}G_x = 0 \tag{9}$$

and [3] a condition that the inductance L given by $$L = -\mu_0 R^2 \sum_m \int d\kappa |\hat{\sigma}_{\phi,m}^P(\kappa)|^2 I'_m(\kappa R)A_m \tag{10}$$

where:

$$A_m = K'_m(\kappa R) - \frac{I'_m(\kappa R)}{I'_m(\kappa R')}K'_m(\kappa R') \tag{11}$$

is to be minimized.

In this manner, as indicated in a part (a) of FIG. 9, the shield pattern 42 corresponding to the primary coil portion 41 alone is obtained. This shield pattern 42 is then subjected to the pattern cutting.

Next, at the step S23, the connecting current distribution is determined by cutting the return portions in the shield pattern. Here, as indicated in a part (b) of FIG. 9, a part or a whole of the current returns is cut out, and the current turns of the shield coil and the current turns of the primary coil are connected by the bridging lines 43.

Here, in general, a number of current turns in the shield coil is smaller than a number the primary coil, in the primary coil, so that there remains some current turns (referred hereafter as remaining turns) in the primary coil which are not connected with the current turns of the shield coil. As indicated in a part (c) of FIG. 9, these remaining turns are connected by the remaining current returns 45 on the primary coil cylinder surface or the connecting face for connecting the primary coil and the shield coil.

Next, at the step S24, the shield patterns 44 and 46 corresponding to the connecting current distribution such as the bridging lines 43 and the remaining current returns 45 are determined. For example, the current distribution $j_i$ of the bridging line in $\rho$-direction can be expressed as:

$$j_i(\rho', \phi', z') = (j_\rho^i(\rho', \phi')\delta(z'-z_0)\delta(\phi'-\phi_0), 0, 0) \tag{12}$$

while the current distribution $j_a$, of the remaining current return can be expressed as:

$$j_a(\rho', \phi', z') = (0, j_\phi^a(\phi')\delta(z'-z_0)\delta(\rho'-\rho_0), 0) \tag{13}$$

where $\rho_0$, $\phi_0$, and $z_0$ indicate coordinate positions of the bridging line or the remaining current return, so that the magnetic field distribution can be determined by using the above described equation (1). The shield patterns 44 and 46 for cancelling the determined magnetic fields at an exterior region are then obtained.

Next, at the step S25, as indicated in a part (d) of FIG. 9, a composed shield pattern 47 is obtained by superposing the shield pattern 42 corresponding to the primary coil determined at the step S21 and the shield patterns 44 and 46 corresponding to the connecting current distribution determined at the step S24.

Then, at the step S26, the composed shield pattern is cut out at the same positions as the return portions are cut at the step S23, and a gradient magnetic field linearity degraded component due to the cutting is obtained. This degraded component corresponds to a new magnetic field generated by the cutting of the shield pattern, which can be expressed by the following equation (14) by using the above described equation (1).

$$B' = \tag{14}$$

$$-\frac{\mu_0}{4\pi^2}\sum_m \int d\kappa e^{j\kappa(z-z')}e^{jm(\phi-\phi')}I_m(\kappa\rho_<)K_m(\kappa\rho_>) \times$$

$$(\nabla \times j^S)W_{cut}(z')\rho' d\rho' d\phi' dz'$$

where:

-continued $$W_{cut}(z') = \begin{cases} 1 \text{ if } |z| < Z_{cut} \\ 0 \text{ if } |z| > Z_{cut} \end{cases} \quad (15)$$

and $Z_{cut}$ is a z-coordinate for the pattern cutting. The degradation due to the connecting current component can be easily calculated from the above described equations (12), (13), and (1). In this manner, the gradient magnetic field degraded component due to the cutting of the composed shield pattern 47 and the connecting current component is obtained.

Next, at the step S27, the primary coil 41 and the corresponding shield pattern 42 for cancelling the gradient magnetic field degraded component are determined for a desired imaging field of view. This can be done by the similar operation as in the above steps S21 and S22, except that it is necessary to add an opposite sign for the gradient magnetic field degraded component to the above described equations (8) and (9).

Then, after pattern cutting the obtained shield pattern 42, the operation returns to the above described step S23. Thereafter, the series of operation in the loop of the steps S23 to S27 is repeated until the optimized coil current patterns for the primary coil, the shield pattern, and the connecting current distribution are finally obtained at the step S28.

In this manner, it becomes possible to make the leaking magnetic field produced by the current distributions of the primary coil and the connecting face to be nearly zero at an exterior region of the shield coil, while generating the gradient magnetic field which has a good linearity in the desired imaging field of view.

Here, for the sake of comparison, the procedure for designing the conventional simple cutting gradient coil shown in FIG. 5B will be explained according to the flow chart of FIG. 10.

First, at the step S31, the conventional current distribution for the primary coil is set up according to the same current distribution base function of FIG. 8B as the conventional ASGC in which the current sum is equal to 0. Then, at the step S32, the current distribution for the shield coil is determined to obtain a shield pattern corresponding to the primary coil, for desired imaging field of view and shielding power, as in indicated in a part (a) of FIG. 11. Then, at the step S33, after the pattern cutting of the primary coil and the shield coil, the connection wirings are determined, and the designing is finished. Here, as indicated in parts (b) and (c) of FIG. 11, no consideration is given to the gradient magnetic field linearity (or the imaging field of view) and the shielding power, so that the degradation due to the presence of the bridging lines and the remaining current returns is left in the designed gradient coil.

Namely, the conventional simple cutting gradient coil achieves a higher field generation efficiency by sacrificing the imaging field of view and the shielding power, in contrast to the present invention in which the imaging field of view and the shielding power comparable to the conventional ASGC are maintained while generating the gradient magnetic field at a high field generation efficiency.

Thus, the gradient coil of this first embodiment is constructed from a primary coil current distribution which is mainly composed of the gradient field generating currents while maintaining the imaging field of view and the shielding power comparable to the conventional ASGC, so that a number of current returns is reduced, and therefore the coil resistance, the local heat generation, and the inductance, the driving power can be reduced compared with the conventional ASGC for generating the same gradient magnetic field strength while the axial length of the gradient coil can be made shorter. With the shorter axial length, a noise and a vibration at a time of the gradient magnetic field switching can be reduced, and a weight and a manufacturing cost of the gradient coil can also be reduced.

It is to be noted that a case of realizing the same gradient magnetic field strength and imaging field of view as the conventional ASGC has been described above, but as an alternative, it is also possible to consider a case of realizing the same inductance and imaging field of view as the conventional ASGC. In this case, the above described design algorithm is carried out with a larger setting value for the gradient magnetic field strength in the above equation (8), while setting the minimum value of the inductance to be the same as in the conventional ASGC.

Also, as another alternative, it is possible to consider a case of realizing the same radius and axial length as the conventional ASGC. In this case, it is possible to enlarge the imaging field of view in the ASGC in the same structure (radius, axial length, etc.) by setting even higher terms of the gradient magnetic field to be 0 in the above equation (9).

Now, the second embodiment of the gradient coil according to the present invention will be described in detail.

Figure 12:
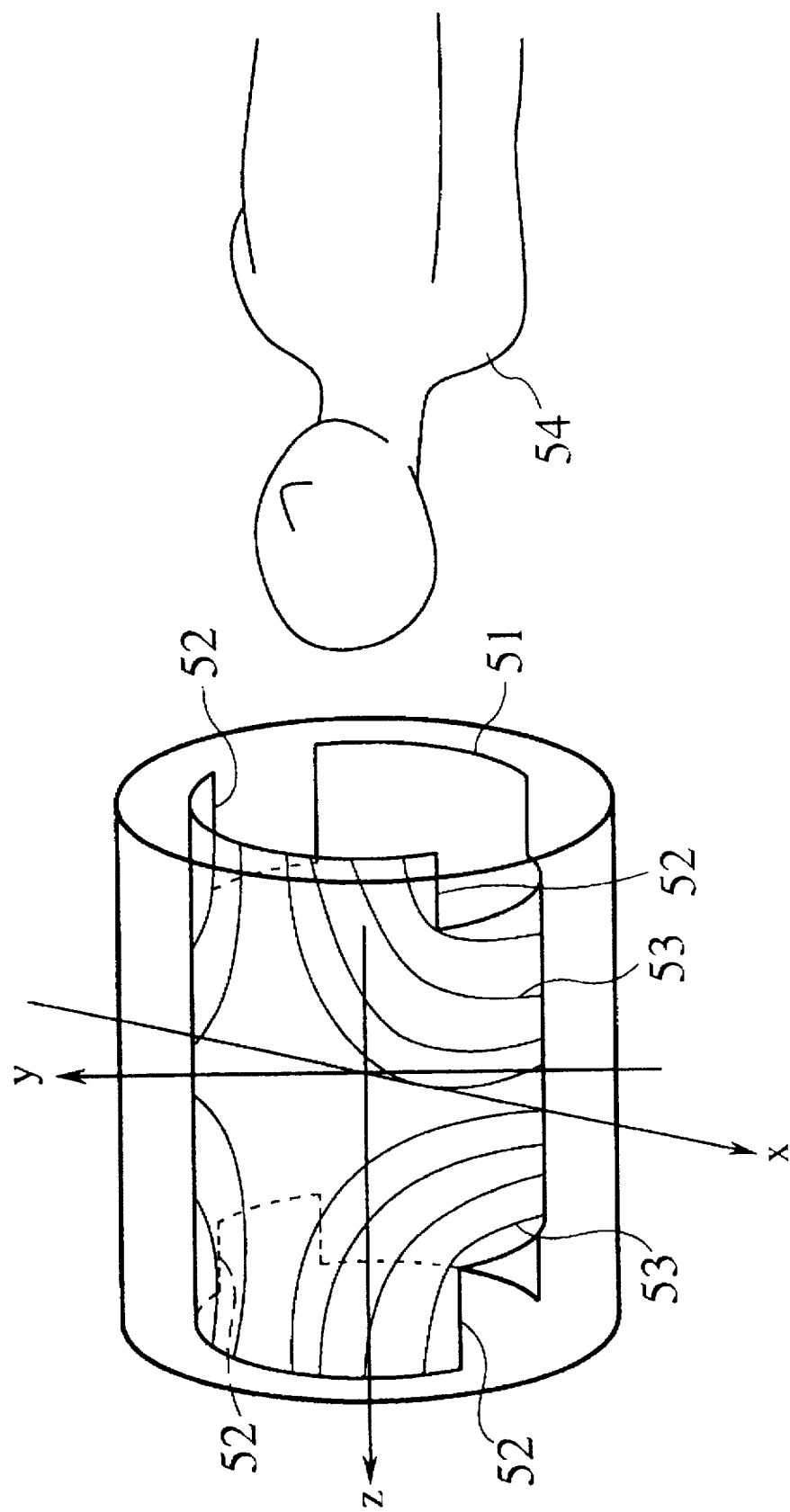
FIG. 12 is a perspective view of the second embodiment of the gradient coil according to the present invention in a case of forming an X coil.

In this second embodiment, the gradient coil has a configuration as shown in FIG. 12, in which a cylindrical primary coil 51 (X coil in FIG. 12) has altogether four rectangular sectional cuttings 52, two on each end in an axial direction. In FIG. 12, the current distribution 53 of the primary coil is arranged to surround each of these sectional cuttings 52 to realize the X coil.

In the conventional cylindrical gradient coil for the head portion imaging, the axial length of the gradient coil has been limited by the shoulders of a patient 54, but in the gradient coil of this second embodiment, the sectional cuttings 52 can provide extra rooms for the shoulders of a patient 54 so that the gradient coil with a longer axial length can be realized.

According to Carlson, et al.: Magnetic Resonance in Medicine, 26, p. 191, 1992, already mentioned above for example, the gradient coil with a longer axial length tends to have a higher field generation efficiency, so that it is possible for the gradient coil of this second embodiment to realize a higher field generation efficiency.

This gradient coil of FIG. 12 can be designed by the same designing algorithm as outlined in FIG. 7 for the first embodiment described above, by replacing the above equation (5) with the following equation (16).

$$\sigma_y{}^p(\phi',z') = \Sigma a_{nm} \cos\left(\frac{2\pi n z'}{l} - \beta\right) e^{im\phi'} W_{sc}(\phi',z'), 0 < \beta < 1 \quad (16)$$

where:

$$W_{sc}(\phi',z') = \begin{cases} 1 \text{ if } (\phi',z') \text{ is not in sectional cutting} \\ 0 \text{ if } (\phi',z') \text{ is in sectional cutting} \end{cases} \quad (17)$$

Figure 13:
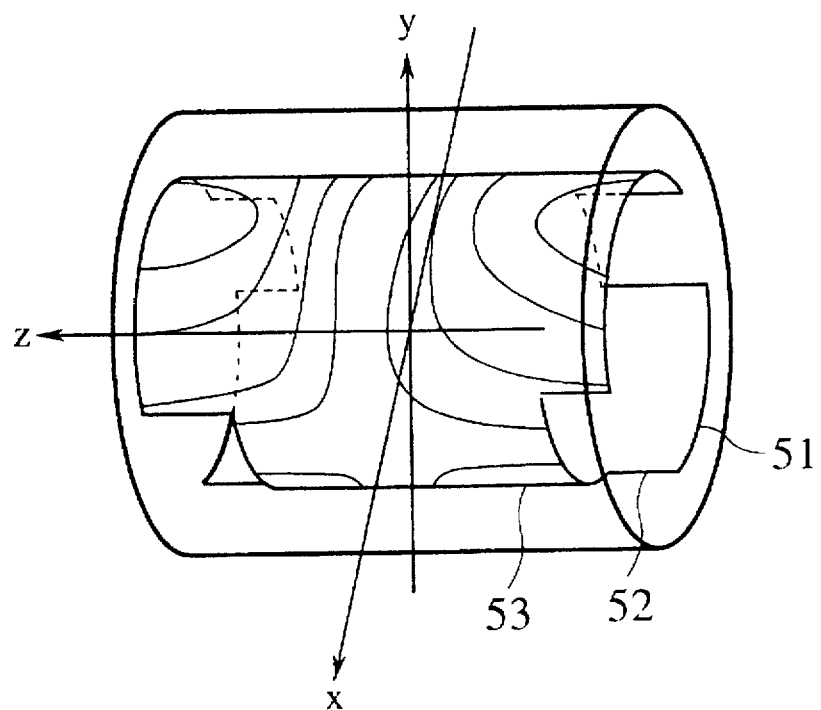
FIG. 13 is a perspective view of the second embodiment of the gradient coil according to the present invention in a case of forming a Y coil.

It is to be noted that this second embodiment is equally applicable to the Y coil as shown in FIG. 13 in which the cylindrical primary coil 51 has four sectional cuttings 52 just as in a case of FIG. 12. In FIG. 13, the current distribution 53 is arranged to straddle over two sectional cuttings 52 at the same end in the axial direction to realize the Y coil.

It is also to be noted that FIG. 12 and FIG. 13 show cases of using sectional cuttings in rectangular shapes, but it is equally possible to achieve the same effect by using the sectional cuttings in other shapes, such as semi-circular shapes, semi-elliptical shapes, parabolic shapes, trapezoidal shapes, etc.

Now, the third embodiment of the gradient coil according to the present invention will be described in detail.

Figure 14:
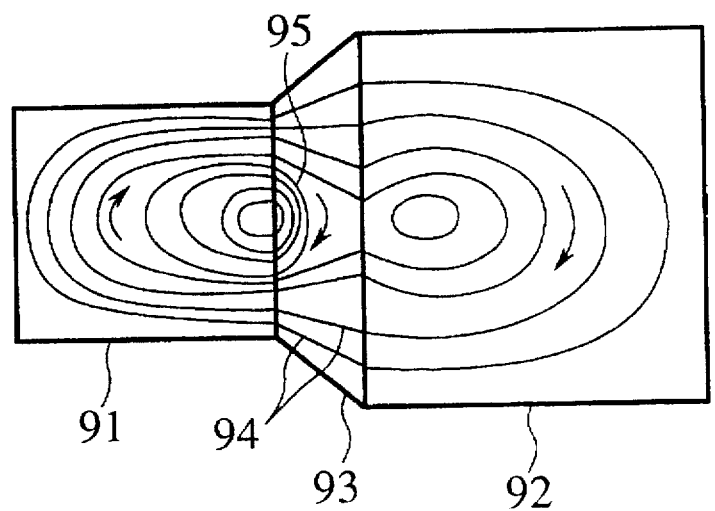
FIG. 14 is a development of a coil pattern for the third embodiment of the gradient coil according to the present invention.

FIG. 14 shows a configuration of the gradient coil in this third embodiment, where a ½ region of a coil pattern for generating the gradient magnetic field in a direction perpendicular to that of the static magnetic field is developed into a plane.

The gradient coil of FIG. 14 comprises a primary coil 91, a shield coil 92, and a connecting face 93 for connecting the primary coil 91 and the shield coil 92, where the primary coil 91 has a current distribution mainly composed of the gradient field generating currents and the shield coil 92 has a current distribution for effectively cancelling out a magnetic field produced by the primary coil 91 and the connecting face 93 at an exterior region. The connecting face 93 includes the bridging lines 94 for connecting the primary coil 91 and the shield coil 92 and the remaining current returns 95 for connecting ends of the horseshoe shaped current patterns on the primary coil 91.

The gradient magnetic field with a high linearity can be generated in a desired imaging field of view inside this gradient coil by means of these current distributions.

The current distributions of these primary coil 91, shield coil 92, and connecting face 93 are actually realized by conductors or copper wires in rectangular cross sections which are manufactured into the current distribution patterns by the etching, etc.

Here, the shield coil 19 in the gradient coil of FIG. 14 is shaped in a pattern for shielding the magnetic field produced by the current distributions of the primary coil 91 and the connecting face 93 by means of the designing algorithm similar to that used in the first embodiment described above, which will now be described.

Namely, the designing algorithm to be used in shaping the gradient coil of this third embodiment can also be outlined by the flow chart of FIG. 7 described above, as follows.

First, at the step S21, the structures of the primary coil and the shield coil such as their radii are determined, and the high efficiency current distribution for the primary coil which is mainly composed of the gradient field generating currents is set up.

Here, the magnetic field B produced by the current distribution j can be expressed in general by the above equation (1). Also, the primary coil current distribution $j^p$ and the shield coil current distribution $j^s$ can be expressed in general by the above equations (2) and (3).

In this case, the current distribution of the primary coil which is mainly composed of the gradient field generating currents satisfies the following relation (18).

$$\int_{z_1}^{z_2} \sigma_\phi^p(\phi',z')dz' \neq 0 \quad (18)$$

where:

$z_1$, $z_2$: z-coordinates of two ends of primary coil.

This relation (18) can be satisfied by setting the current density $\sigma_\phi$ as in the following equation (19) for example.

$$\sigma_\phi^p(\phi',z') = \sum_{n,m} \left\{ a_{nm}\cos\left(\frac{n\pi z'}{2(z_2-z_1)} \beta_c\right) + b_{nm}\sin\left(\frac{n\pi z'}{2(z_2-z_1)} \beta_s\right) \right\} e^{im\phi'} \quad (19)$$

$0 < \beta_c < 1, 0 < \beta_s < 1$

Here, factors $\beta_c$ and $\beta_s$ are introduced for the first time by the present invention in order to make it possible to deal with the gradient field generating currents.

Next, at the step S22, the current distribution for the shield coil is determined to obtain a shield pattern corresponding to the primary coil, for desired imaging field of view and shielding power. Here, the procedure for determining the current distribution for the shield coil is substantially the same as that described above for the first embodiment in conjunction with the above equations (6) to (11). In this manner, as indicated in a part (a) of FIG. 15, the shield pattern 122 corresponding to the primary coil portion 121 alone is obtained. This shield pattern 122 is then subjected to the pattern cutting. Next, at the step S23, the connecting current distribution is determined by cutting the return portions in the shield pattern. Here, as indicated in a part (b) of FIG. 11, a part or a whole of the current returns is cut out, and the current turns of the shield coil and the current turns of the primary coil are connected by the bridging lines 124.

Also, in general, a number of current turns in the shield coil is smaller than a number of current turns in the primary coil, so that there remains the remaining turns in the primary coil. As indicated in a part (c) of FIG. 11, these remaining turns are connected by the remaining current returns 126 on the primary coil cylinder surface or the connecting face for connecting the primary coil and the shield coil.

Next, at the step S24, the shield patterns 125 and 127 corresponding to the connecting current distribution such as the bridging lines 124 and the remaining current returns 126 are determined. The procedure for determining these shield patterns 125 and 127 is substantially the same as that described above for the first embodiment.

Figure 15:
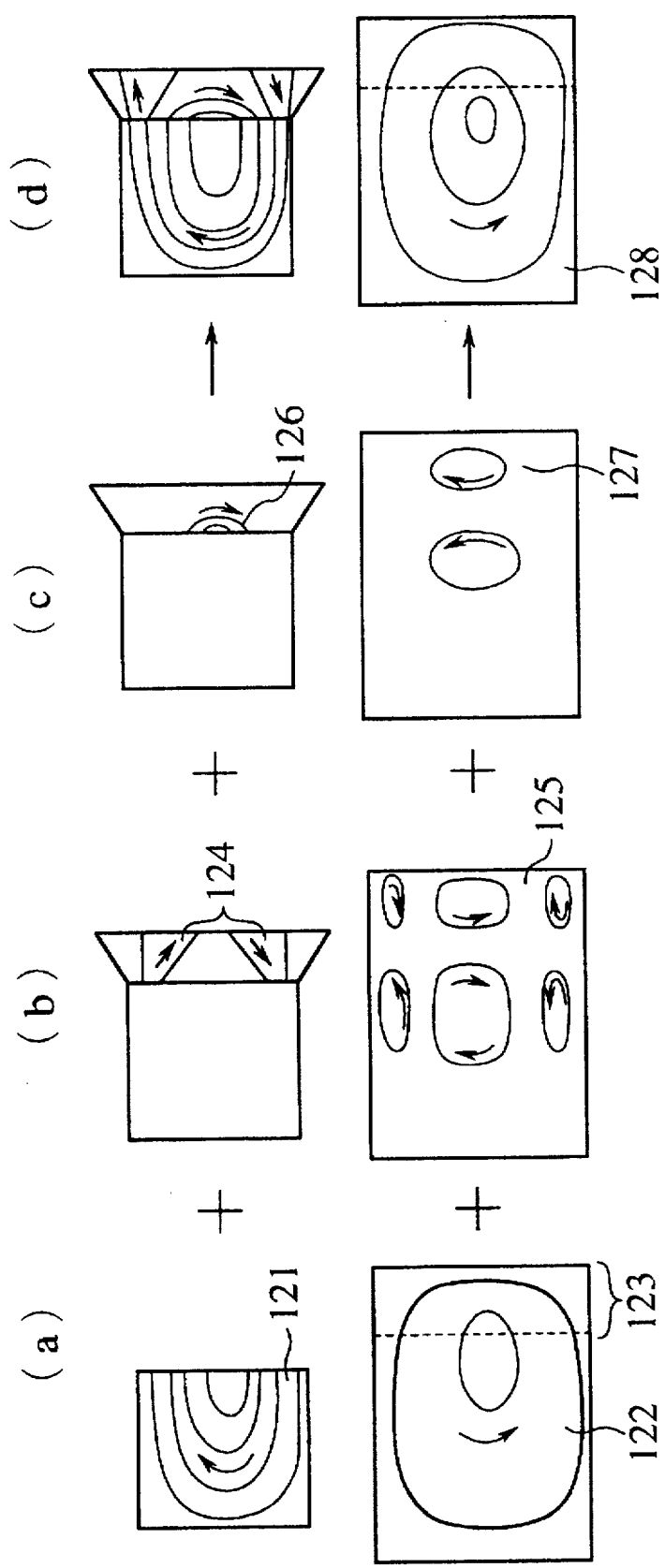
FIG. 15 is a diagram illustrating an outline of the procedure for designing the coil pattern of FIG. 14 in the present invention.

Next, at the step S25, as indicated in a part (d) of FIG. 15, a composed shield pattern 118 is obtained by superposing the shield pattern 122 corresponding to the primary coil determined at the step S21 and the shield patterns 125 and 127 corresponding to the connecting current distribution determined at the step S24.

Next, at the step S26, the composed shield pattern is cut out at the same positions as the return portions are cut at the step S23, and a gradient magnetic field linearity degraded component due to the cutting is obtained, while the degradation due to the connecting current component is calculated, and the gradient magnetic field degraded component due to the cutting of the shield pattern 128 and the connecting current component is obtained, just as in the first embodiment.

Next, at the step S27, the primary coil 121 and the corresponding shield pattern 122 for cancelling the gradient magnetic field degraded component are determined for a desired imaging field of view, just as in the first embodiment.

Then, after pattern cutting the obtained shield pattern 122, the operation returns to the above described step S23. Thereafter, the series of operation in the loop of the steps S23 to S27 is repeated until the optimized coil current patterns for the primary coil, the shield pattern, and the connecting current distribution are finally obtained at the step S28.

In this manner, it becomes possible to make the leaking magnetic field produced by the current distributions of the primary coil and the connecting face to be nearly zero at an exterior region of the shield coil, while generating the gradient magnetic field which has a good linearity in the desired imaging field of view. Here, due to the magnetic field cancellation effect by the shield coil, a number of turns in the primary coil is greater than that in a non-shielding type gradient coil, but the increase of the inductance is suppressed by the cutting of the current returns.

In addition, as the directions of the currents are opposite in the primary coil and the shield coil, the Lorentz forces exerted on the current turns cancel each other, so that it is possible to reduce the torque exerted on the gradient coil as a whole.

Figure 16:
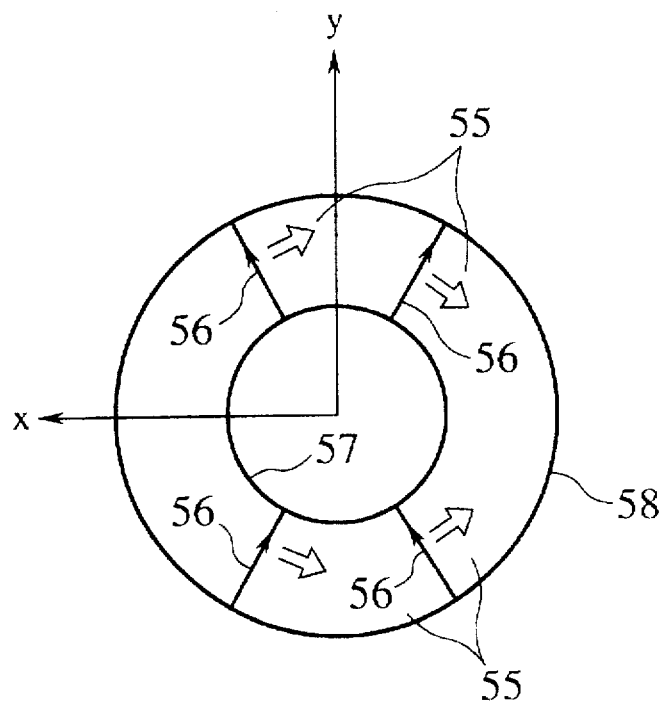
FIG. 16 is an illustration for explaining the Lorentz force exerted on bridging lines in the gradient coil of FIG. 14.
Figure 17:
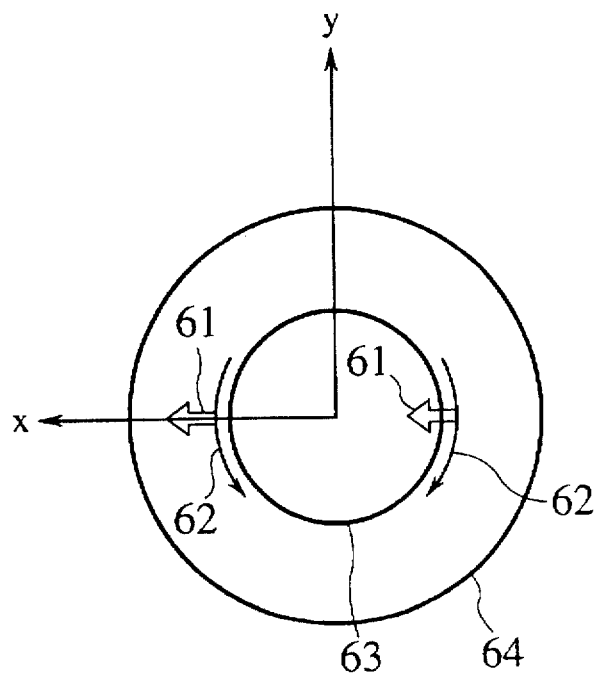
FIG. 17 is an illustration for explaining the Lorentz force exerted on remaining current returns in the gradient coil of FIG. 14.

Here, the Lorentz forces exerted on the bridging lines appear as shown in FIG. 16, which shows a view of the gradient coil in a direction of the static magnetic field, where a circle 57 represents the primary coil and a circle 58 represents the shield coil. In this case, the Lorentz force 55 exerted on each bridging line 56 is perpendicular to a direction of currents in the bridging line 56, and as a whole, a force in a negative x-direction is exerted. On the other hand, the Lorentz forces exerted on the remaining current returns appear as shown in FIG. 17, which also shows a view of the gradient coil in a direction of the static magnetic field, where a circle 63 represents the primary coil and a circle 64 represents the shield coil. In this case, the Lorentz force 61 exerted on each remaining current return 62 is perpendicular to a direction of currents in each remaining current return 62, and as a whole, a force in a positive x-direction is exerted. Thus, the Lorentz forces exerted on the bridging lines and the remaining current returns cancel each other, and therefore the generated torque is small.

Consequently, the torque appearing in the gradient coil of this third embodiment is considerably smaller than that appearing in the conventional asymmetric gradient coil.

Moreover, the axial length of the gradient coil of this third embodiment can be shorter compared with the conventional ASGC or the conventional asymmetric gradient coil, while the Lorentz force exerted on the gradient coil becomes small, so that the noise and vibration at a time of the gradient magnetic field switching can be reduced, and a weight and a manufacturing cost of the gradient coil can also be reduced.

Now, the fourth embodiment of the gradient coil according to the present invention will be described in detail.

Figure 18A:
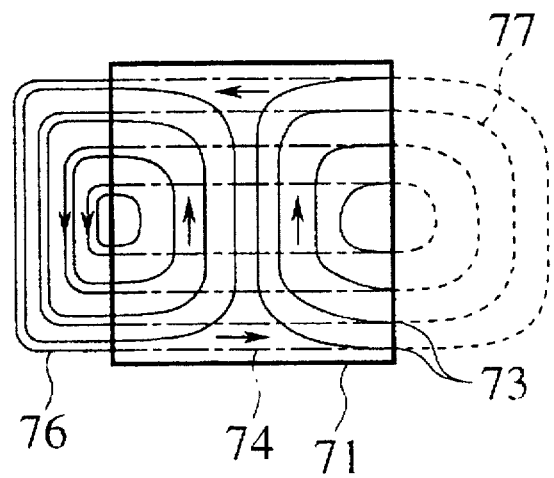
FIG. 18A is a development of a coil pattern for a primary coil in the fourth embodiment of the gradient coil according to the present invention.
Figure 18B:
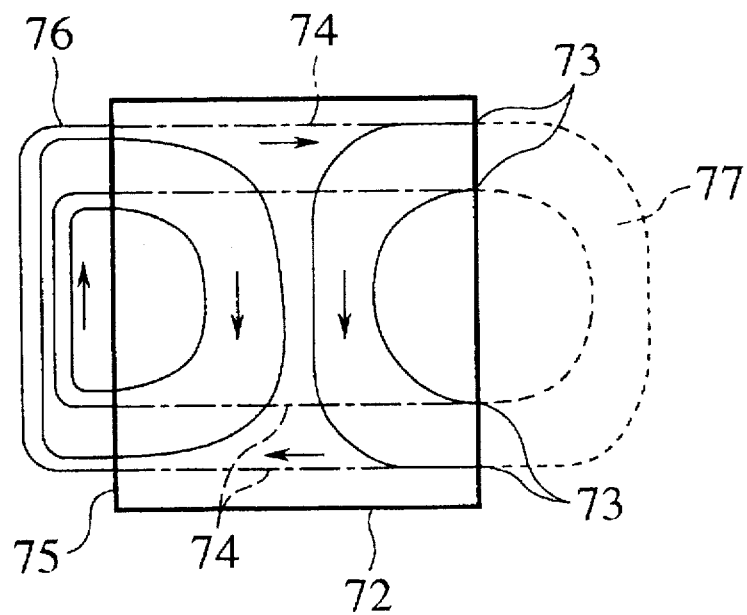
FIG. 18B is a development of a coil pattern for a shield coil in the fourth embodiment of the gradient coil according to the present invention.

In this fourth embodiment, the gradient coil comprises the primary coil 71 with a current turn configuration as shown in FIG. 18A and the shield coil 72 with a current turn configuration as shown in FIG. 18B, where FIGS. 18A and 18B show a ½ region of the respective current turn configurations developed into a plane.

In this fourth embodiment, a part or a whole of the current returns of the conventional ASGC is cut out, and an end point 73 of each turn on one side end of each coil is turned back to the other side end 75 of each coil, by means of a current path 74 (to be referred hereafter as a z-direction current path) which is parallel to the z-direction (a direction of the static magnetic field) as indicated by a chain line in FIGS. 18A and 18B, and the ends of each turn are connected together at that other side end 75 of each coil by means of a remaining current return 76. In FIGS. 18A and 18B, the spiral shaped pattern 77 including a dashed line portion is the current pattern for the conventional ASGC, where a dashed line portion is a cut out portion in this fourth embodiment.

Here, the z-direction current path 74 generates no z-direction magnetic field component, so that it does not affect the gradient magnetic field linearity at all, and no Lorentz force is exerted thereon. In other words, each of the primary coil and the shield coil of this fourth embodiment is constructed from the fingerprint shaped current distribution which generates the gradient magnetic field, and the z-direction current paths which do not generate the gradient magnetic field.

Now, the fifth embodiment of the gradient coil according to the present invention will be described in detail.

Figure 19A:
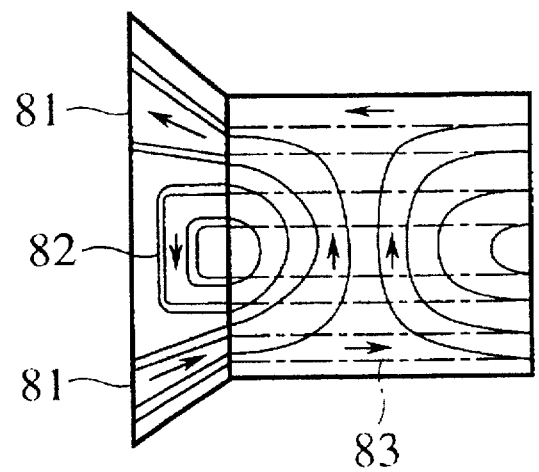
FIG. 19A is a development of a coil pattern for a primary coil in the fifth embodiment of the gradient coil according to the present invention.
Figure 19B:
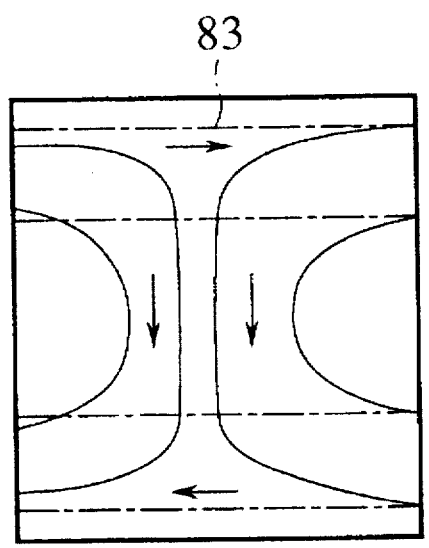
FIG. 19B is a development of a coil pattern for a shield coil in the fifth embodiment of the gradient coil according to the present invention.

In this fifth embodiment, the gradient coil comprises the primary coil with a current turn configuration as shown In FIG. 19A and the shield coil with a current turn configuration as shown in FIG. 19B, where FIGS. 19A and 19B show a ½ region of the respective current turn configurations developed into a plane.

In this fifth embodiment, an end point of each turn on one side end of each coil is turned back to the other side end of each coil, by means of the z-direction current path 83, just as in the fourth embodiment described above. Then, a part of the current turns of the primary coil similar to that of the fourth embodiment described above are connected with the current turns of the shield coil similar to that of the fourth embodiment described above by the bridging lines 81, while the rest of the current turns of the primary coil are connected by the remaining current returns 82, and the composed shield pattern is formed to cancel out the leaking magnetic field due to the primary coil, the bridging lines 81 and the remaining current returns 82.

In this case, because of the use of the bridging lines 81, a number of remaining current returns 82 in the primary coil and the shield coil can be reduced, so that the inductance of the gradient coil can be reduced compared with the fourth embodiment described above.

Figure 20:
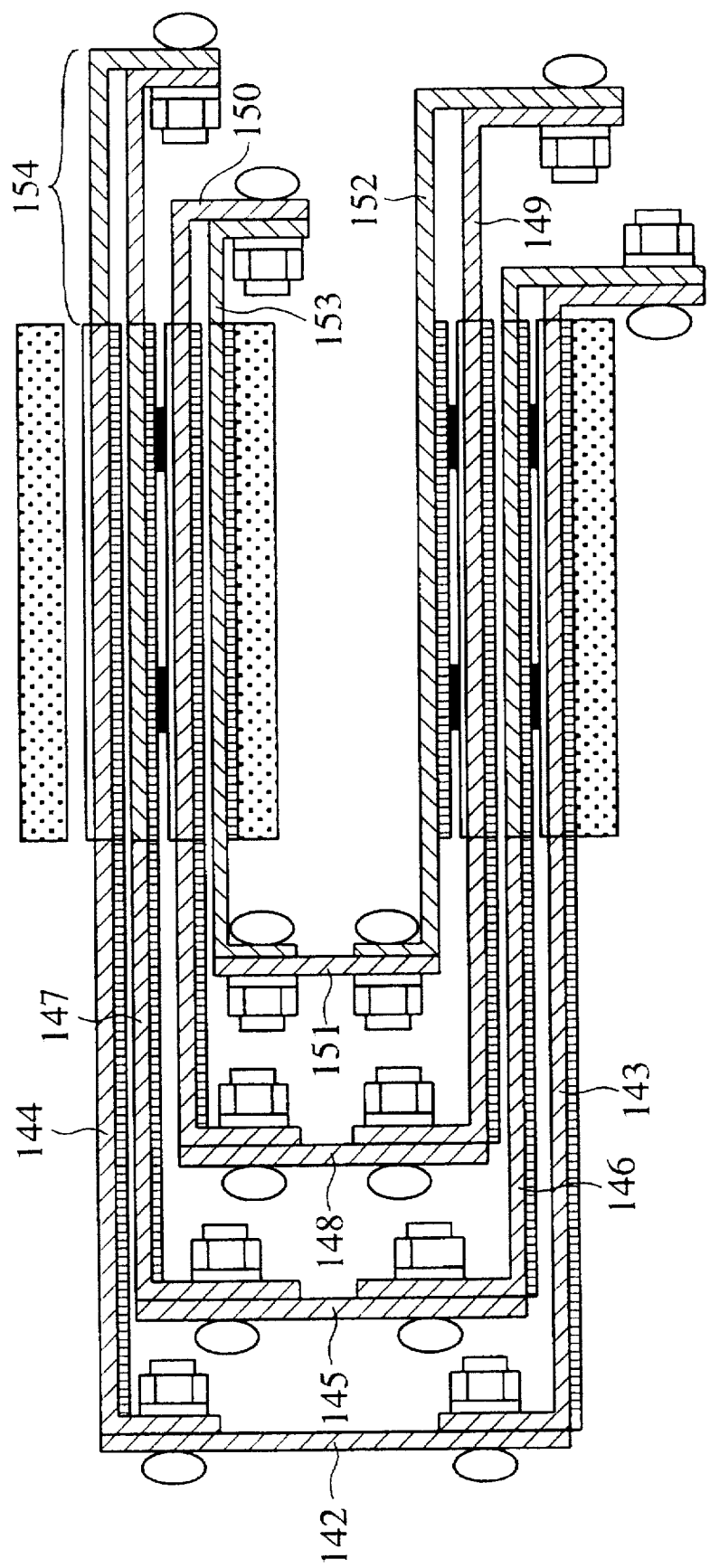
FIG. 20 is a cross sectional view of a gradient coil structure suitable for the fifth embodiment of the gradient coil according to the present invention.

Now, the gradient coil of this fifth embodiment can be formed in a structure shown in FIG. 20, which shows a cross sectional view in an axial direction of a layer structure for both X and Y gradient coils. Here, each of the X coil and the Y coil is formed by four layers of conductors, with an insulative layer inserted between each adjacent conductors.

More specifically, in FIG. 20, a bridging line 142 connects a primary coil fingerprint shaped current distribution layer 143 and a shield coil fingerprint shaped current distribution layer 144 for the X coil, while a bridging line 145 connects a primary coil z-direction current path layer 146 and a shield coil z-direction current path layer 147 for the X coil. Similarly, a bridging line 148 connects a primary coil fingerprint shaped current distribution layer 149 and a shield coil fingerprint shaped current distribution layer 150 for the Y coil, while a bridging line 151 connects a primary coil z-direction current path layer 152 and a shield coil z-direction current path layer 153 for the Y coil. The fingerprint shaped current distribution layer and the z-direction current path layer for each of the primary coil and the shield coil are connected together in a region 154, current turn by current turn.

With this configuration of FIG. 20, it is possible to make a large conductor cross sectional area for each current layer, so that it is possible to reduce the local heat generation at a time of generating the gradient magnetic field as strong as 20 mT/m or more.

In FIG. 20, a coil assembly of the fingerprint shaped current distribution layers for the primary coil and the shield coil and the bridging line connecting them is formed to enclose a coil assembly of the z-direction current path layers for the primary coil and the shield coil and the bridging line connecting them, but it is also possible to reverse this layer order such that the latter encloses the former.

Now, the sixth embodiment of the gradient coil according to the present invention will be described in detail.

Figure 21A:
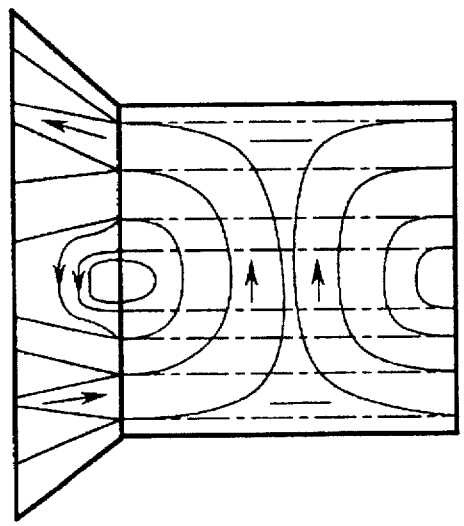
FIG. 21A is a development of a coil pattern for a primary coil in the sixth embodiment of the gradient coil according to the present invention.
Figure 21B:
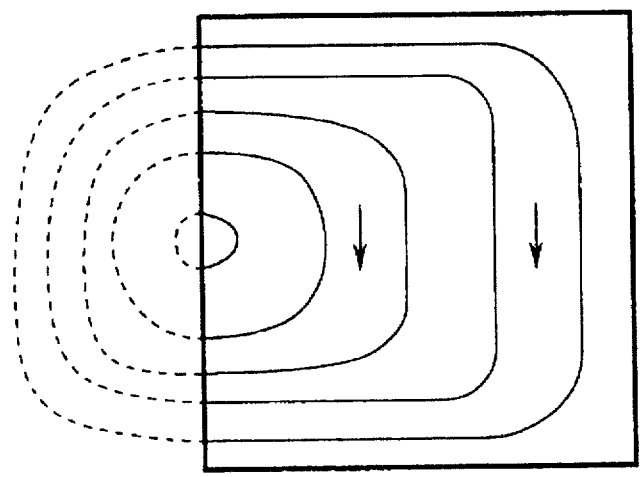
FIG. 21B is a development of a coil pattern for a shield coil in the sixth embodiment of the gradient coil according to the present invention.

In this sixth embodiment, the gradient coil comprises the primary coil with a current turn configuration as shown in FIG. 21A and the shield coil with a current turn configuration as shown in FIG. 21B, where FIGS. 21A and 21B show a ½ region of the respective current turn configurations developed into a plane.

In this sixth embodiment, the composed shield pattern is formed to cancel out the leaking magnetic field due not only to the primary coil, the bridging lines, and the remaining current returns, but also to the z-direction current paths in the primary coil as well.

Here, the current density $j_{I,z}$ of the z-direction current path in the primary coil can be expressed by the following equation (20).

$$j_{I,z}(\rho', \phi', z') = (0, 0, j_z^I \,^z(\phi', z')\delta(\rho'-R)) \quad (20)$$

Thus, the z-direction current paths can be handled just like the bridging lines and the remaining current returns, by obtaining the shield pattern corresponding to the z-direction current paths in the primary coil at the step S24 of FIG. 7, and obtaining the gradient magnetic field degraded component due to the cutting of the composed shield pattern at the step S26 of FIG. 7, so as to cancel out the gradient magnetic field degradation in the same manner as described above for the first embodiment.

In this manner, it is possible to realize the gradient coil with a higher shielding power compared with the fifth embodiment described above.

Figure 22:
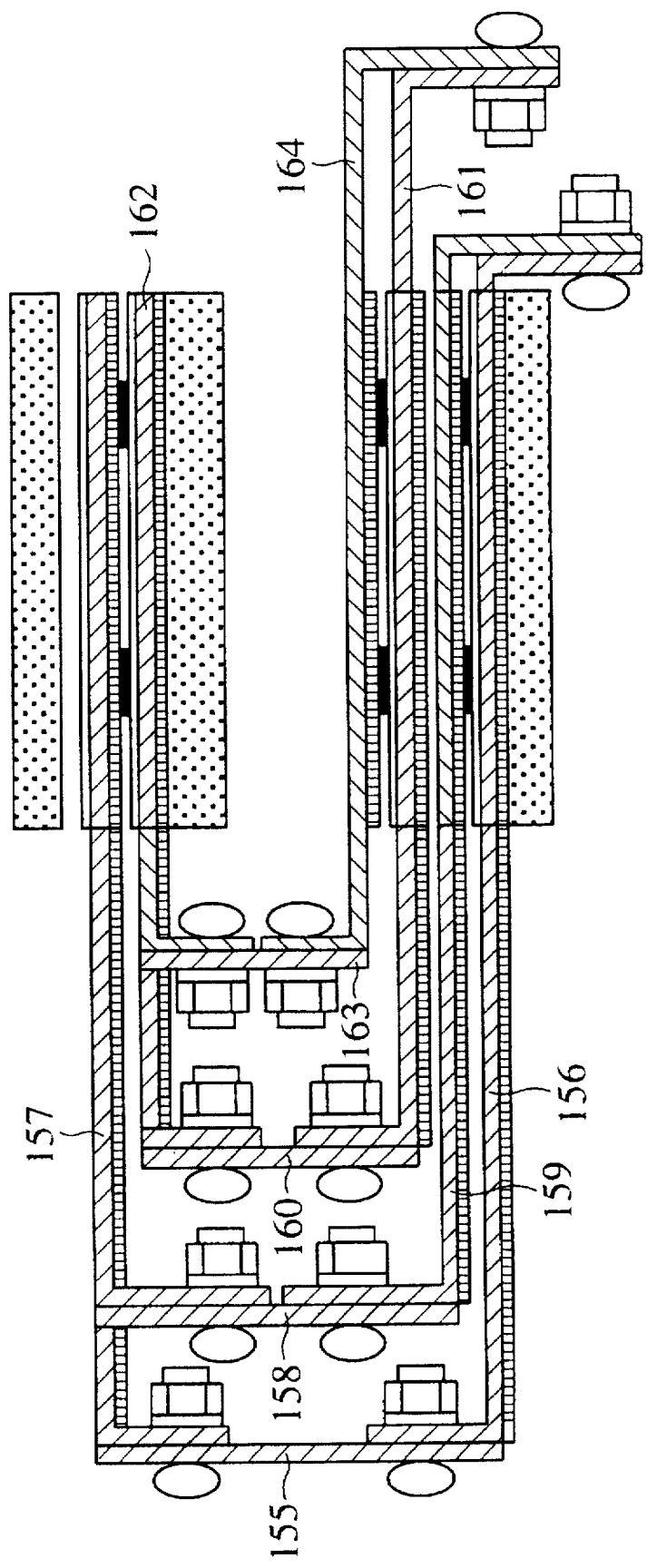
FIG. 22 is a cross sectional view of a gradient coil structure suitable for the sixth embodiment of the gradient coil according to the present invention.

Now, the gradient coil of this sixth embodiment can be formed in a structure shown in FIG. 22, which shows a cross sectional view in an axial direction of a layer structure for both X and Y gradient coils. Here, each of the X coil and the Y coil is formed by three layers of conductors, with an insulative layer inserted between each adjacent conductors. In each of the X coil and the Y coil, the primary coil has the fingerprint shaped current distribution layer and the z-direction current path layer, while the shield coil has a single shield coil conductor layer.

More specifically, in FIG. 22, a primary coil fingerprint shaped current distribution layer 156 and a primary coil z-direction current path layer 159 for the X coil are connected with a shield coil conductor layer 157 for the X coil by bridge lines 155 and 158, while a primary coil fingerprint shaped current distribution layer 161 and a primary coil z-direction current path layer 164 for the Y coil are connected with a shield coil conductor layer 162 for the Y coil by bridge lines 160 and 163.

This configuration of FIG. 22 corresponds to a case of modifying the third embodiment described above to form the primary coil current distribution in two layers including the z-direction current path layer and the fingerprint shaped current distribution layer.

With this configuration of FIG. 22, by forming the primary coil in two layers, a number of turns in a circumferential direction per one layer can be reduced in a region near the positions to connect the bridging lines and the remaining current returns, so that it is possible to make a large conductor cross sectional area per each turn, and it is possible to reduce the local heat generation.

Thus, the gradient coil of this sixth embodiment has a higher shielding power compared with the fifth embodiment described above, an equivalent field generation efficiency as the third embodiment described above, and a smaller local heat generation compared with the third embodiment described above.

It is to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. A gradient coil for nuclear magnetic resonance imaging, comprising:

a primary coil having a fingerprint shaped current distribution formed on an inner cylinder in which at least a part of current return lines is cut out to form a cut out part with broken current return lines;

a shield coil having a current distribution formed on an outer cylinder; and a bridging connection member for connecting the cut out part of the current return lines of the primary coil with the shield coil;

wherein the current distribution of the shield coil is a composition of a first shield pattern for cancelling out a magnetic field produced by the primary coil outside the outer cylinder and a second shield pattern for cancelling out a magnetic field produced by the bridging connection member outside the outer cylinder.

2. The gradient coil of claim 1, further comprising a return connection member for connecting remaining current turns of the primary coil, the remaining current turns being current turns in the cut out part of the current return lines of the primary coil which are not connected with the shield coil by the bridging connection member, and wherein the current distribution of the shield coil is a composition of the first shield pattern, the second shield pattern, and a third shield pattern for cancelling out a magnetic field produced by the return connection member outside the outer cylinder.

3. The gradient coil of claim 2, wherein the bridging connection member and the return connection member are arranged such that a Lorentz force exerted on the bridging connection member and a Lorentz force exerted on the return connection member cancel each other.

4. The gradient coil of claim 1, wherein the fingerprint shaped current distribution of the primary coil, the current distribution of the shield coil, and a current distribution of the bridging connection member are set in a current distribution pattern for realizing a desired gradient magnetic field linearity in a desired imaging field of view within the inner cylinder.

5. The gradient coil of claim 1, wherein the inner cylinder has a pair of sectional cuttings on one end of the inner cylinder.

6. The gradient coil of claim 1, wherein a first channel coil assembly formed by a first channel part of the primary coil, a first channel part of the shield coil, and a first channel part of the bridging connection member is enclosed within a second channel coil assembly formed by a second channel part of the primary coil, a second channel part of the shield coil, and a second channel part of the bridging connection member.

7. The gradient coil of claim 1, wherein the primary coil has turn back current paths for leading the cut out part of the current return lines on one end of the gradient coil to another end of the gradient coil.

8. The gradient coil of claim 7, wherein the turn back current paths are substantially parallel to an axial direction of the gradient coil.

9. The gradient coil of claim 7, further comprising a return connection member for connecting the cut out part of the current return lines together at said another end of the gradient coil.

10. The gradient coil of claim 7, wherein the bridging connection member connects the cut out part of the current return lines and the turn back current paths of the primary coil with the shield coil.

11. The gradient coil of claim 7, wherein the fingerprint shaped current distribution and the turn back current paths of the primary coil are formed on separate layers.

12. The gradient coil of claim 7, wherein the shield coil has a current distribution in which at least a part of shield coil current return lines is cut out to form a cut out part with broken shield coil current return lines and shield coil turn back current paths for leading the cut out part of the shield coil current return lines on one end of the gradient coil to said another end of the gradient coil.

13. The gradient coil of claim 12, wherein the shield coil turn back current paths are substantially parallel to an axial direction of the gradient coil.

14. The gradient coil of claim 12, further comprising a shield coil return connection member for connecting the cut out part of the shield coil current return lines together at said another end of the gradient coil.

15. The gradient coil of claim 12, wherein the bridging connection member connects the cut out part of the current return lines and the turn back current paths of the primary coil with the shield coil current return lines and the shield coil turn back current paths.

16. The gradient coil of claim 12, wherein the current distribution and the turn back current paths of the shield coil are formed on separate layers.

17. A gradient coil for nuclear magnetic resonance imaging, comprising:

a primary coil having a fingerprint shaped current distribution formed on an inner cylinder in which at least a part of current return lines is cut out to form a cut out part with broken current return lines, and turn back current paths for leading the cut out part of the current return lines on one end of the gradient coil to another end of the gradient coil; and a shield coil having a current distribution formed on an outer cylinder for cancelling out a magnetic field produced by the primary coil outside the outer cylinder.

18. The gradient coil of claim 17, wherein the turn back current paths are substantially parallel to an axial direction of the gradient coil.

19. The gradient coil of claim 17, further comprising a return connection member for connecting the cut out part of the current return lines together at said another end of the gradient coil.

20. The gradient coil of claim 17, further comprising a bridging connection member for connecting the cut out part of the current return lines and the turn back current paths of the primary coil with the shield coil.

21. The gradient coil of claim 17, wherein the fingerprint shaped current distribution and the turn back current paths of the primary coil are formed on separate layers.

22. The gradient coil of claim 17, wherein the shield coil has a current distribution in which at least a part of shield coil current return lines is cut out to form a cut out part with broken shield coil current return lines and shield coil turn back current paths for leading the cut out part of the shield coil current return lines on one end of the gradient coil to said another end of the gradient coil.

23. The gradient coil of claim 22, wherein the shield coil turn back current paths are substantially parallel to an axial direction of the gradient coil.

24. The gradient coil of claim 22, further comprising a shield coil return connection member for connecting the cut out part of the shield coil current return lines together at said another end of the gradient coil.

25. The gradient coil of claim 22, further comprising a bridging connection member for connecting the cut out part of the current return lines and the turn back current paths of the primary coil with the shield coil current return lines and the shield coil turn back current paths.

26. The gradient coil of claim 22, wherein the current distribution and the turn back current paths of the shield coil are formed on separate layers.

27. The gradient coil of claim 17, wherein a first channel coil assembly formed by a first channel part of the primary coil and a first channel part of the shield coil is enclosed within a second channel coil assembly formed by a second channel part of the primary coil and a second channel part of the shield coil.

28. A nuclear magnetic resonance imaging apparatus, comprising:

a gradient coil including a primary coil having a fingerprint shaped current distribution formed on an inner cylinder in which at least a part of current return lines is cut out to form a cut out part with broken current return lines;

a shield coil having a current distribution formed on an outer cylinder; and a bridging connection member for connecting the cut out part of the current return lines of the primary coil with the shield coil;

wherein the current distribution of the shield coil is a composition of a first shield pattern for cancelling out a magnetic field produced by the primary coil outside the outer cylinder and a second shield pattern for cancelling out a magnetic field produced by the bridging connection member outside the outer cylinder; and imaging means for imaging a body to be examined placed in a homogeneous static magnetic field by applying a radio frequency magnetic field onto the body to be examined and operating the gradient coil to apply gradient magnetic fields onto the body to be examined according to a pulse sequence, detecting nuclear magnetic resonance signals emitted from the body to be examined in response to the radio frequency magnetic field and the gradient magnetic fields, and processing the nuclear magnetic resonance signals to construct nuclear magnetic resonance images.

29. The apparatus of claim 28, further comprising a return connection member for connecting remaining current turns of the primary coil, the remaining current turns being current turns in the cut out part of the current return lines of the primary coil which are not connected with the shield coil by the bridging connection member, and wherein the current distribution of the shield coil is a composition of the first shield pattern, the second shield pattern, and a third shield pattern for cancelling out a magnetic field produced by the return connection member outside the outer cylinder.

30. The apparatus of claim 29, wherein the bridging connection member and the return connection member are arranged such that a Lorentz force exerted on the bridging connection member and a Lorentz force exerted on the return connection member cancel each other.

31. The apparatus of claim 28, wherein the fingerprint shaped current distribution of the primary coil, the current distribution of the shield coil, and a current distribution of the bridging connection member are set in a current distribution pattern for realizing a desired gradient magnetic field linearity in a desired imaging field of view within the inner cylinder.

32. The apparatus of claim 28, wherein the inner cylinder has a pair of sectional cuttings on one end of the inner cylinder.

33. The apparatus of claim 28, wherein a first channel coil assembly formed by a first channel part of the primary coil, a first channel part of the shield coil, and a first channel part of the bridging connection member is enclosed within a second channel coil assembly formed by a second channel part of the primary coil, a second channel part of the shield coil, and a second channel part of the bridging connection member.

34. The apparatus of claim 28, wherein the primary coil has turn back current paths for leading the cut out part of the current return lines on one end of the gradient coil to another end of the gradient coil.

35. The apparatus of claim 34, wherein the turn back current paths are substantially parallel to an axial direction of the gradient coil.

36. The apparatus of claim 34, further comprising a return connection member for connecting the cut out part of the current return lines together at said another end of the gradient coil.

37. The apparatus of claim 34, wherein the bridging connection member connects the cut out part of the current return lines and the turn back current paths of the primary coil with the shield coil.

38. The apparatus of claim 34, wherein the fingerprint shaped current distribution and the turn back current paths of the primary coil are formed on separate layers.

39. The apparatus of claim 34, wherein the shield coil has a current distribution in which at least a part of shield coil current return lines is cut out to form a cut out part with broken shield coil current return lines and shield coil turn back current paths for leading the cut out part of the shield coil current return lines on one end of the gradient coil to said another end of the gradient coil.

40. The apparatus of claim 39, wherein the shield coil turn back current paths are substantially parallel to an axial direction of the gradient coil.

41. The apparatus of claim 39, further comprising a shield coil return connection member for connecting the cut out part of the shield coil current return lines together at said another end of the gradient coil.

42. The apparatus of claim 39, wherein the bridging connection member connects the cut out part of the current return lines and the turn back current paths of the primary coil with the shield coil current return lines and the shield coil turn back current paths.

43. The apparatus of claim 39, wherein the current distribution and the turn back current paths of the shield coil are formed on separate layers.

44. A nuclear magnetic resonance imaging apparatus, comprising:

a gradient coil including
a primary coil having a fingerprint shaped current distribution formed on an inner cylinder in which at least a part of current return lines is cut out to form a cut out part with broken current return lines, and turn back current paths for leading the cut out part of the current return lines on one end of the gradient coil to another end of the gradient coil; and
a shield coil having a current distribution formed on an outer cylinder for cancelling out a magnetic field produced by the primary coil outside the outer cylinder; and imaging means for imaging a body to be examined placed in a homogeneous static magnetic field by applying a radio frequency magnetic field onto the body to be examined and operating the gradient coil to apply gradient magnetic fields onto the body to be examined according to a pulse sequence, detecting nuclear magnetic resonance signals emitted from the body to be examined in response to the radio frequency magnetic field and the gradient magnetic fields, and processing the nuclear magnetic resonance signals to construct nuclear magnetic resonance images.

45. The apparatus of claim 44, wherein the turn back current paths are substantially parallel to an axial direction of the gradient coil.

46. The apparatus of claim 44, further comprising a return connection member for connecting the cut out part of the current return lines together at said another end of the gradient coil.

47. The apparatus of claim 44, further comprising a bridging connection member for connecting the cut out part of the current return lines and the turn back current paths of the primary coil with the shield coil.

48. The apparatus of claim 44, wherein the fingerprint shaped current distribution and the turn back current paths of the primary coil are formed on separate layers.

49. The apparatus of claim 44, wherein the shield coil has a current distribution in which at least a part of shield coil current return lines is cut out to form a cut out part with broken shield coil current return lines and shield coil turn back current paths for leading the cut out part of the shield coil current return lines on one end of the gradient coil to said another end of the gradient coil.

50. The apparatus of claim 49, wherein the shield coil turn back current paths are substantially parallel to an axial direction of the gradient coil.

51. The apparatus of claim 49, further comprising a shield coil return connection member for connecting the cut out part of the shield coil current return lines together at said another end of the gradient coil.

52. The apparatus of claim 49, further comprising a bridging connection member for connecting the cut out part of the current return lines and the turn back current paths of the primary coil with the shield coil current return lines and the shield coil turn back current paths.

53. The apparatus of claim 49, wherein the current distribution and the turn back current paths of the shield coil are formed on separate layers.

54. The apparatus of claim 44, wherein a first channel coil assembly formed by a first channel part of the primary coil and a first channel part of the shield coil is enclosed within a second channel coil assembly formed by a second channel part of the primary coil and a second channel part of the shield coil.

* * * * *